(12) United States Patent
Lai et al.

(10) Patent No.: US 12,040,285 B2
(45) Date of Patent: Jul. 16, 2024

(54) STRUCTURE AND FORMATION METHOD OF CHIP PACKAGE WITH REINFORCING STRUCTURES

(71) Applicant: Taiwan Semiconductor Manufacturing Company, Ltd., Hsinchu (TW)

(72) Inventors: Po-Chen Lai, Hsinchu County (TW); Ming-Chih Yew, Hsinchu (TW); Po-Yao Lin, Hsinchu County (TW); Yu-Sheng Lin, Zhubei (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 104 days.

(21) Appl. No.: 17/461,391

(22) Filed: Aug. 30, 2021

(65) Prior Publication Data

US 2023/0064277 A1 Mar. 2, 2023

(51) Int. Cl.
*H01L 23/00* (2006.01)
*H01L 21/56* (2006.01)
*H01L 23/31* (2006.01)
*H01L 25/065* (2023.01)

(52) U.S. Cl.
CPC .......... *H01L 23/562* (2013.01); *H01L 21/563* (2013.01); *H01L 23/3185* (2013.01); *H01L 24/73* (2013.01); *H01L 25/0655* (2013.01); *H01L 2224/73204* (2013.01)

(58) Field of Classification Search
CPC . H01L 21/563; H01L 21/568; H01L 21/6835; H01L 2221/68345; H01L 2224/73204; H01L 2225/06517; H01L 2225/06572; H01L 23/13; H01L 23/16; H01L 23/3185; H01L 23/49816; H01L 23/5383; H01L 23/5385; H01L 23/562;
(Continued)

(56) References Cited

U.S. PATENT DOCUMENTS 6,034,333 A * 3/2000 Skipor ................ H01L 23/562
174/521
6,570,259 B2 * 5/2003 Alcoe .................... H01L 23/16
257/737
(Continued)

FOREIGN PATENT DOCUMENTS

CN 101150095 A 3/2008
CN 103811429 A 5/2014
(Continued)

*Primary Examiner* — Telly D Green
(74) *Attorney, Agent, or Firm* — Birch, Stewart, Kolasch & Birch, LLP

(57) ABSTRACT

A package structure and a formation method of a package structure are provided. The package structure includes a circuit substrate and a die package bonded to the circuit substrate through bonding structures. The package structure also includes a reinforcing structure over the circuit substrate. The reinforcing structure partially surrounds a corner of the die package. The package structure further includes an underfill structure surrounding the bonding structure. The underfill structure is in direct contact with the reinforcing structure.

20 Claims, 24 Drawing Sheets

(58) Field of Classification Search
CPC .. H01L 24/73; H01L 25/0652; H01L 25/0655
See application file for complete search history.

(56) References Cited

U.S. PATENT DOCUMENTS

| | | | |
|---|---|---|---|
| 6,667,557 B2 * | 12/2003 | Alcoe | H01L 21/563 |
| | | | 174/541 |
| 8,993,380 B2 | 3/2015 | Hou et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,342,320 B2 * | 5/2022 | Elsherbini | H01L 24/81 |
| 2002/0135063 A1 | 9/2002 | Alcoe et al. | |
| 2003/0210531 A1 * | 11/2003 | Alcoe | H01L 23/16 |
| | | | 361/728 |
| 2010/0078791 A1 * | 4/2010 | Yim | H01L 25/105 |
| | | | 257/E23.129 |
| 2012/0187583 A1 * | 7/2012 | Karpur | H01L 21/563 |
| | | | 257/E23.129 |
| 2013/0062752 A1 * | 3/2013 | Lin | H01L 23/36 |
| | | | 257/729 |
| 2014/0091461 A1 * | 4/2014 | Shen | H01L 23/24 |
| | | | 257/737 |
| 2014/0167243 A1 * | 6/2014 | Shen | H01L 23/10 |
| | | | 257/692 |
| 2016/0013077 A1 | 1/2016 | Yang | |
| 2019/0122999 A1 | 4/2019 | Hung | |
| 2020/0227401 A1 * | 7/2020 | Elsherbini | H01L 24/83 |
| 2021/0028081 A1 | 1/2021 | Yu et al. | |
| 2022/0102233 A1 * | 3/2022 | Tsai | H01L 21/50 |
| 2022/0320063 A1 * | 10/2022 | Chou | H01L 24/92 |
| 2023/0064957 A1 * | 3/2023 | Lin | H01L 21/6835 |
| 2023/0326880 A1 * | 10/2023 | Hu | H01L 23/3135 |
| | | | 257/668 |

FOREIGN PATENT DOCUMENTS

| | | | | |
|---|---|---|---|---|
| CN | 108431946 A | * | 8/2018 | ......... H01L 21/4817 |
| EP | 2311084 B1 | * | 6/2018 | ........... H01L 21/565 |
| TW | 200423332 A | | 11/2004 | |
| TW | 201901909 A | | 1/2019 | |
| WO | WO2020/232725 A1 | | 11/2020 | |

* cited by examiner

STRUCTURE AND FORMATION METHOD OF CHIP PACKAGE WITH REINFORCING STRUCTURES

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
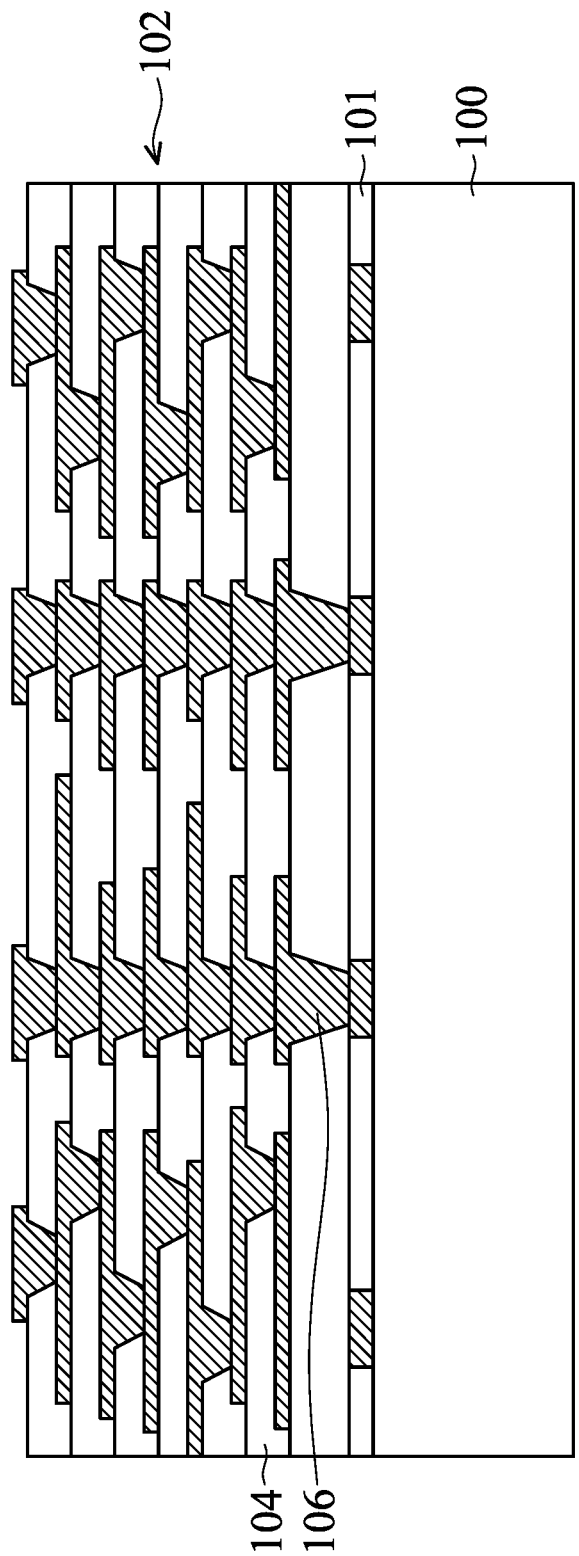
FIGS. 1A-1F are cross-sectional views of various stages of a process for forming a portion of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to package structures such as three-dimensional (3D) packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are cross-sectional views of various stages of a process for forming a package structure, in accordance with some embodiments. As shown in FIG. 1A, a carrier substrate 100 is provided or received. The carrier substrate 100 is used as a support substrate during the fabrication process. In some embodiments, the carrier substrate 100 is a temporary support carrier and will be removed later.

The carrier substrate 100 may be made of or include a dielectric material, a semiconductor material, one or more other suitable materials, or a combination thereof. In some embodiments, the carrier substrate 100 is a dielectric substrate, such as a glass wafer. In some other embodiments, the carrier substrate 100 is a semiconductor substrate, such as a silicon wafer. The semiconductor substrate may be made of or include silicon, germanium, silicon germanium, one or more other suitable semiconductor materials, or a combination thereof.

As shown in FIG. 1A, a redistribution structure 102 is formed over the carrier substrate 100, in accordance with some embodiments. The redistribution structure 102 may include a release film 101, multiple insulating layers 104, and multiple conductive features 106. The release film 101 and the carrier substrate 100 may together be removed later.

In some embodiments, the insulating layers 104 are polymer-containing layers. The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104. These openings may be used to contain some of the conductive features 106.

The conductive features 106 may include conductive lines, conductive vias, and/or conductive pads. The conductive features 106 may be made of or include copper, cobalt, tin, titanium, gold, platinum, aluminum, tungsten, one or more other suitable materials, or a combination thereof. The conductive features 106 may be formed using an electroplating process, an electroless plating process, one or more other applicable processes, or a combination thereof. The formation of the conductive features 106 may further involve one or more etching processes.

As shown in FIG. 1A, some of the conductive features 106 in the redistribution structure 102 are conductive vias. In some embodiments, the upper portion of the conductive via is wider than the lower portion of the conductive via, as shown in FIG. 1A.

In some embodiments, the redistribution structure 102 functions as an organic interposer. However, embodiments of the disclosure are not limited thereto. In some other embodiments, a semiconductor interposer is used as the redistribution structure 102.

Figure 1B:
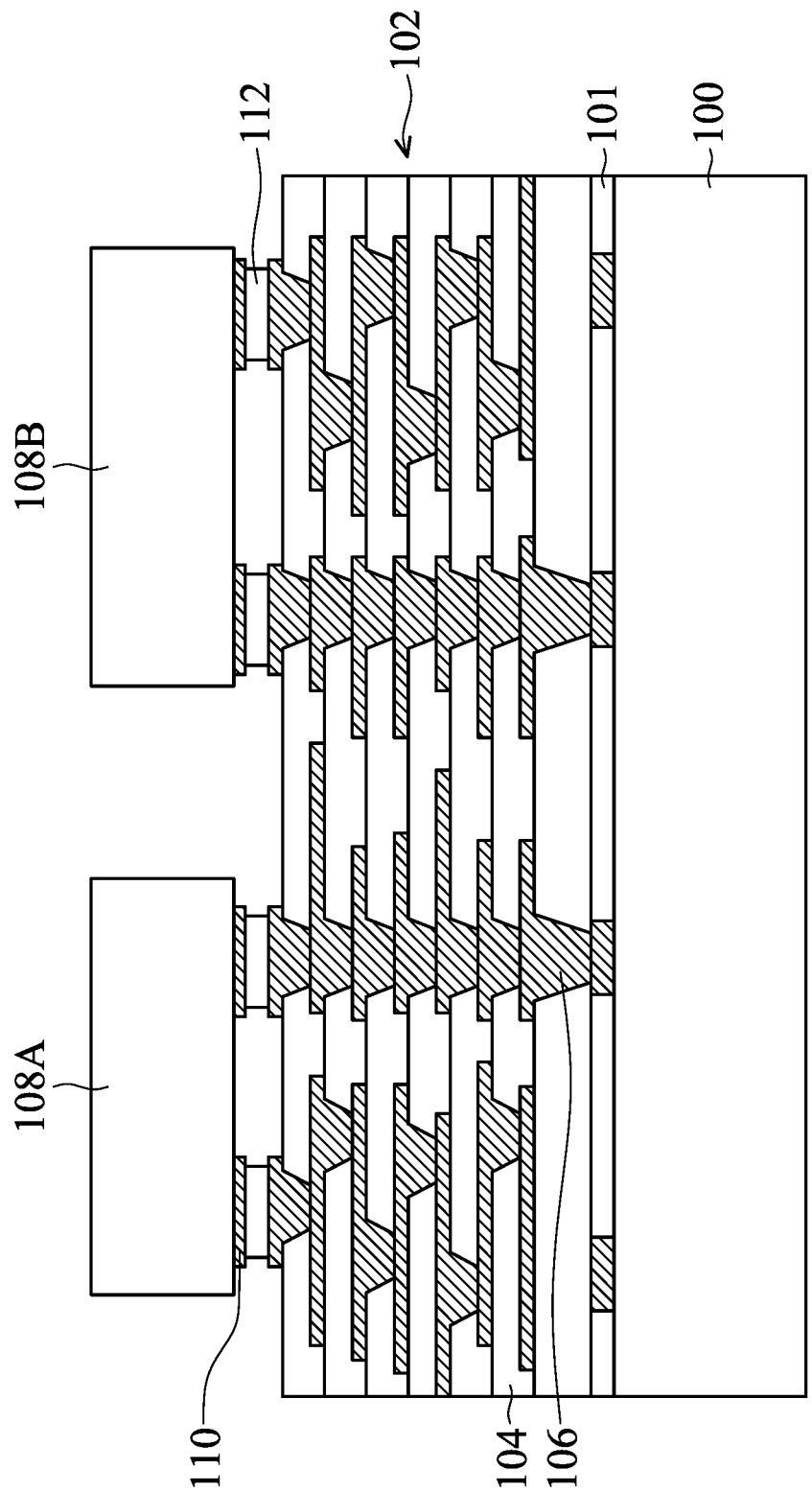

As shown in FIG. 1B, multiple chip structures (or chip-containing structures) 108A and 108B are disposed over the redistribution structure 102, in accordance with some embodiments. In some embodiments, before the chip structures 108A and 108B are disposed, a testing operation is performed to the redistribution structure 102 to ensure the quality and reliability of the redistribution structure 102.

In some embodiments, the chip structures 108A and 108B are bonded onto the conductive pads of the redistribution structure 102 through conductive connectors 112. In some embodiments, each of the chip structures 108A and 108B includes conductive pillars (or conductive pads) 110 with solder elements formed thereon. Solder elements may also be formed on the conductive pads of the redistribution structure 102. The chip structures 108A and 108B are picked and placed onto the redistribution structure 102. In some embodiments, the solder elements of the chip structures 108A and 108B and/or the solder elements on the conductive pads of the redistribution structure 102 are reflowed together. As a result, the reflowed solder elements form the conductive connectors 112.

Each of the chip structures 108A and 108B may be a single semiconductor die, system-on-integrated-chips (SoIC), and/or a package including one or more semiconductor dies that are encapsulated or protected. For the system-on-integrated-chips, multiple semiconductor dies may be stacked and bonded together to form electrical connections between these semiconductor dies. In some embodiments, the semiconductor dies are system-on-chip (SoC) chips that include multiple functions. In some embodiments, the back sides of the semiconductor dies face upwards with the front sides of the semiconductor dies facing the redistribution structure 102. In some embodiments, some of the semiconductor dies include memory devices such as high bandwidth memory (HBM) devices. In some embodiments, the chip structures 108A and 108B are semiconductor dies such as SoC dies. In some embodiments, each of the chip structures 108A and 108B is system-on-integrated-chips (SoIC) that includes multiple semiconductor dies that are stacked together. In some other embodiments, the chip structures 108A and 108B are packages that include one or more semiconductor dies therein. In some other embodiments, the chip structure 108A is an SoIC die, and the chip structure 108B includes memory devices.

Figure 1C:
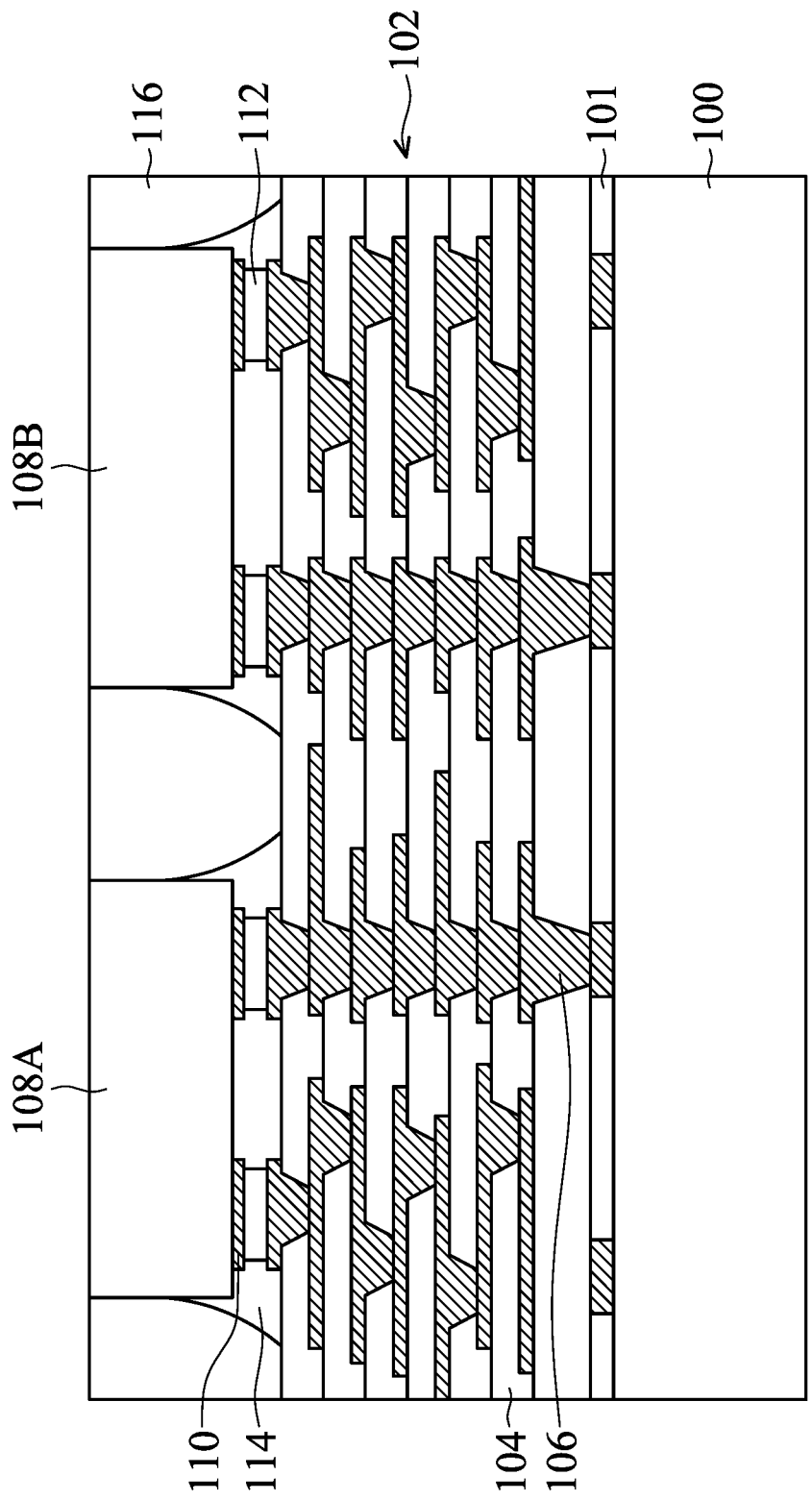

As shown in FIG. 1C, an underfill material 114 is formed to surround and protect the conductive connectors 112, in accordance with some embodiments. The underfill material 114 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

Afterwards, a protective layer 116 is formed over the redistribution structure 102 to surround and protect the chip structures 108A and 108B, as shown in FIG. 1C in accordance with some embodiments. In some embodiments, the protective layer 116 is in direct contact with the redistribution structure 102. In some embodiments, the protective layer 116 is separated from the conductive connectors 112 below the chip structures 108A and 108B by the underfill material 114.

However, embodiments of the disclosure are not limited thereto. Many variations and/or modifications can be made to embodiments of the disclosure. In some other embodiments, the underfill material 114 is not formed. In these cases, the protective layer 116 may be in direct contact with the conductive connectors 112 below the chip structures 108A and 108B.

In some embodiments, the protective layer 116 is made of or includes an insulating material such as a molding material. The molding material may include a polymer material, such as an epoxy-based resin with fillers dispersed therein. The fillers may include fibers (such as silica fibers and/or carbon-containing fibers), particles (such as silica particles and/or carbon-containing particles), or a combination thereof. In some embodiments, the distribution density of the fillers in the protective layer 116 is greater than the distribution density of the fillers in the underfill material 114. In some embodiments, the weight percentage of the fillers in the protective layer 116 is greater than the weight percentage of the fillers in the underfill material 114. The profiles, sizes, and/or materials of the fillers in the protective layer 116 and the underfill material 114 may be different from each other.

In some embodiments, a molding material (such as a flowable molding material) is introduced or injected to cover the redistribution structure 102 and the chip structures 108A and 108B. In some embodiments, a thermal process is then used to cure the flowable molding material and to transform it into the protective layer 116. In some embodiments, a planarization process is performed to the protective layer 116 to improve the flatness of the protective layer 116. For example, the planarization process may include a grinding process, a CMP process, a dry polishing process, one or more other applicable processes, or a combination thereof. In some embodiments, after the planarization process, the surfaces of the chip structures 108A and 108B are exposed. In some embodiments, the top surface of the protective layer 116 is substantially level with the surfaces of the chip structures 108A and 108B.

Figure 1D:
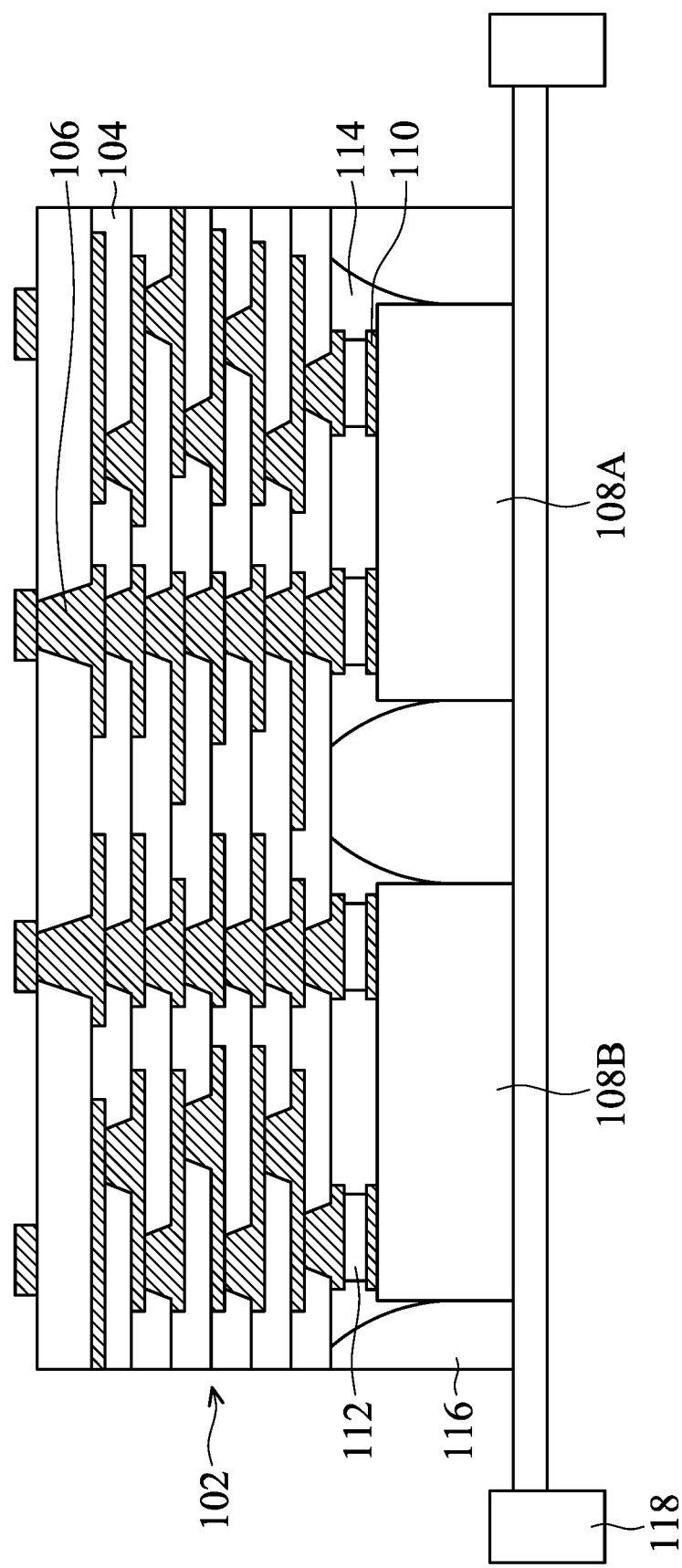

Afterwards, the structure shown in FIG. 1C is flipped upside down and attached onto a carrier tape 118, in accordance with some embodiments. Afterwards, the carrier substrate 100 and the release film 101 are removed, as shown in FIG. 1D in accordance with some embodiments. As a result, the surface of the redistribution structure 102 that is originally covered by the carrier substrate 100 is exposed.

Figure 1E:
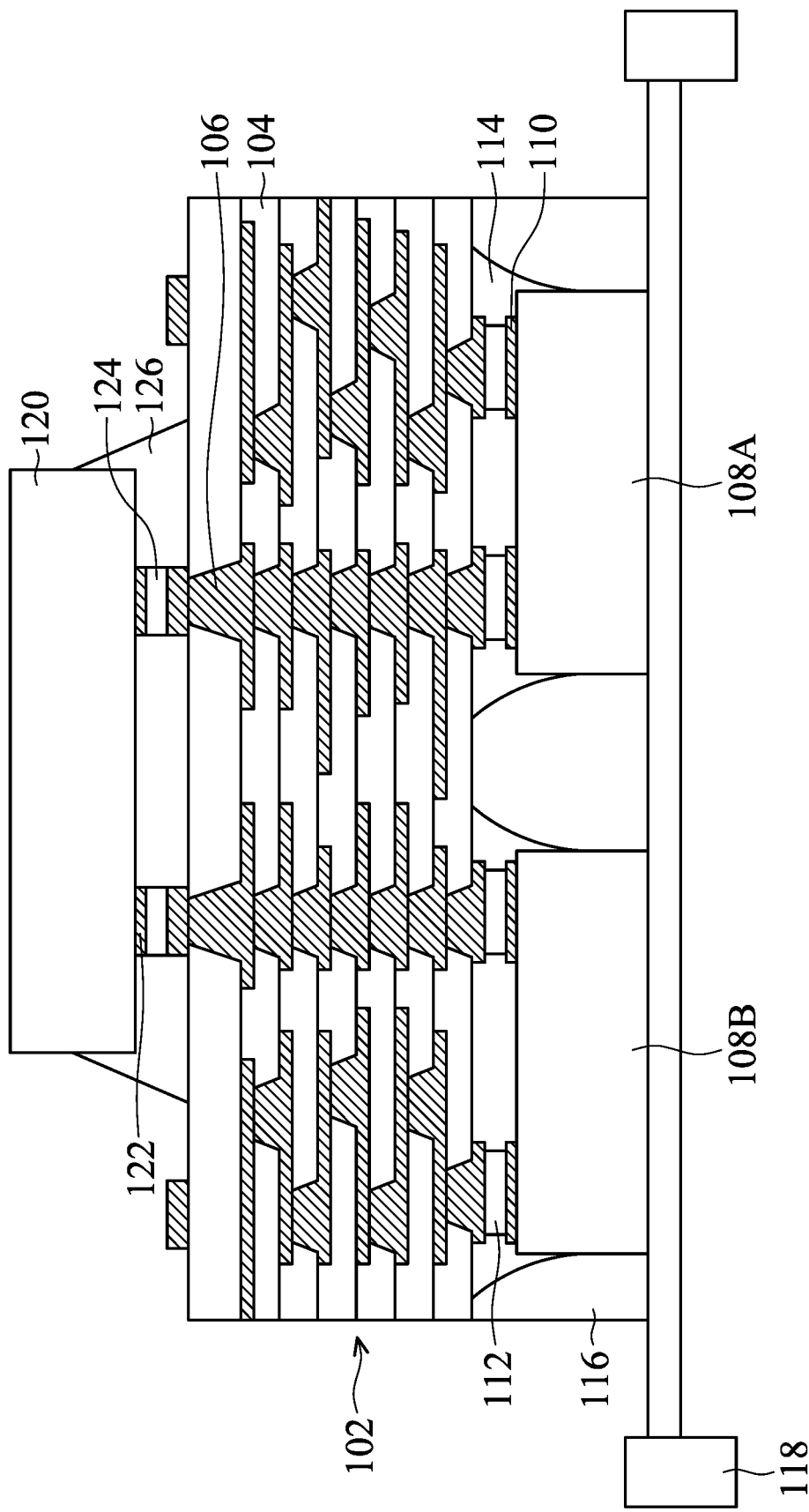

As shown in FIG. 1E, one or more chip structures (or chip-containing structures) 120 are bonded to the redistribution structure 102 through conductive connectors 124, in accordance with some embodiments. The material and formation method of the conductive connectors 124 may be the same as or similar to those of the conductive connectors 112. Through the conductive connectors 124, electrical connections are formed between the conductive pillars (or conductive pads) 122 of the chip structure 120 and some of the conductive features 106 of the redistribution structure 102. In some embodiments, the chip structure 120 forms electrical connections between the chip structures 108A and 108B through some of the conductive features 106 of the redistribution structure 102, as shown in FIG. 1E.

The chip structure 120 may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, some of the semiconductor dies include memory devices such as high bandwidth memory (HBM) devices. In some embodiments, the chip structure 120 is an interconnection die that receive and/or transfer electrical signals to and/or from the chip structures 108A and 108B. In some embodiments, the chip structure 120 has no active devices formed therein. In some other embodiments, the chip structure 120 includes active devices and passive devices formed therein. In some other embodiments, a surface mounted device is used to replace the chip structure 120. The surface mounted device may include, for example, resistors, capacitors, insulators, one or more other suitable devices, or a combination thereof.

As shown in FIG. 1E, an underfill material 126 is formed over the redistribution structure 102 to surround the conductive connectors 124, in accordance with some embodiments. The material and formation method of the underfill material 126 may be the same as or similar to those of the underfill material 114. Many variations and/or modifications can be made to embodiments of the disclosure. In some other embodiments, the underfill material 126 is not formed. In some other embodiments, the chip structure 120 is not formed.

Figure 1F:
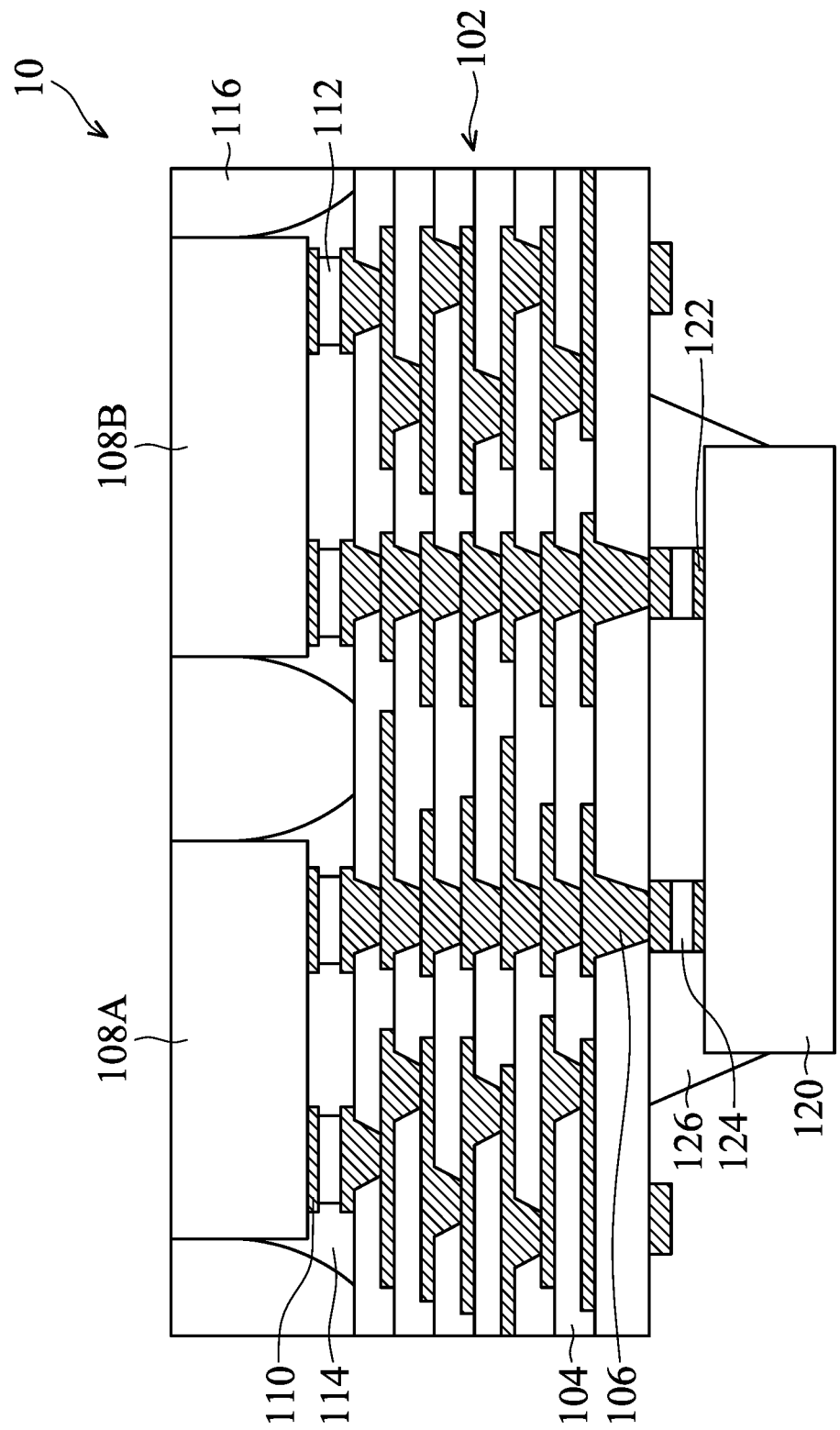

In some embodiments, a sawing process is used to cut through the structure shown in FIG. 1E into multiple separate die packages. After the sawing process, one die package 10 is picked from the carrier tape 118 and turned upside down, as shown in FIG. 1F in accordance with some embodiments. The die package 10 is to be integrated with other elements to form a larger package structure.

However, embodiments of the disclosure are not limited thereto. Many variations and/or modifications can be made to embodiments of the disclosure. In some other embodiments, the sawing process is not performed to separate the structure in FIG. 1E into multiple smaller die packages. The entirety of the package structure may directly be integrated into a large package structure without being sawed.

Figure 2A:
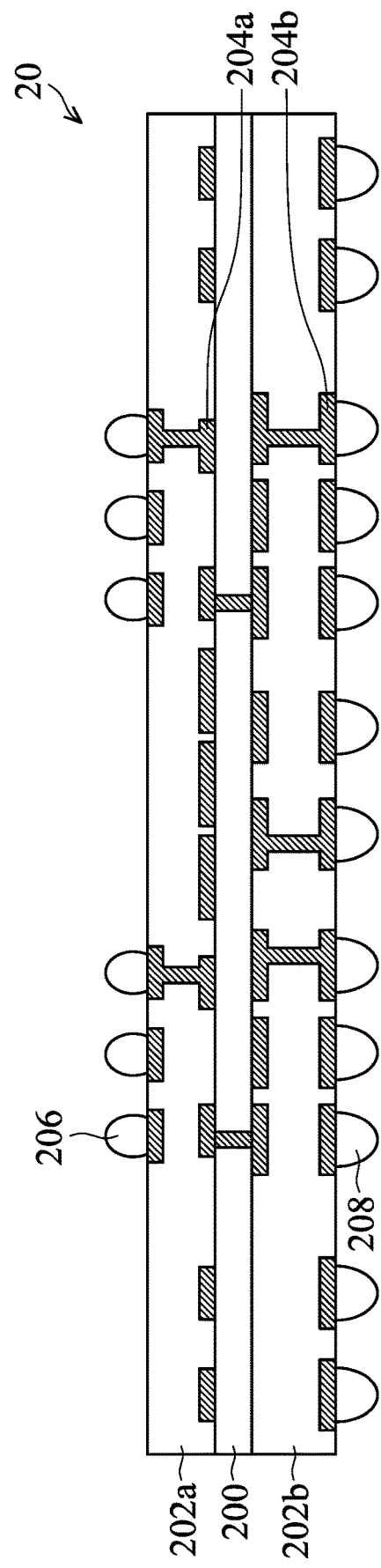
FIGS. 2A-2F are cross-sectional views of various stages of a process for forming a portion of a package structure, in accordance with some embodiments.

FIGS. 2A-2F are cross-sectional views of various stages of a process for forming a portion of a package structure, in accordance with some embodiments. As shown in FIG. 2A, a circuit substrate (or a package substrate) 20 is received or provided. In some embodiments, the circuit substrate 20 includes a core portion 200. The circuit substrate 20 may further includes multiple insulating layers 202*a* and 202*b* and multiple conductive features 204*a* and 204*b*.

The conductive features 204*a* and 204*b* may be used to route electrical signals between opposite sides of the circuit substrate 20. The insulating layers 202*a* and 202*b* may be made of or include one or more polymer materials. The conductive features 204*a* and 204*b* may be made of or include copper, aluminum, cobalt, tungsten, gold, one or more other suitable materials, or a combination thereof.

The core portion 200 may include organic materials such as materials that can be easily laminated. In some embodiments, the core portion 200 may include a single-sided or double-sided copper clad laminate, epoxy, resin, glass fiber, molding compound, plastic (such as polyvinylchloride (PVC), acrylonitril, butadiene and styrene (ABS), polypropylene (PP), polyethylene (PE), polystyrene (PS), polymethyl methacrylate (PMMA), polyethylene terephthalate (PET), polycarbonates (PC), polyphenylene sulfide (PPS)), one or more other suitable elements, or a combination thereof. Conductive vias may extend through the core portion 200 to provide electrical connections between elements disposed on either side of the core portion 200. In some embodiments, the circuit substrate 20 further includes bonding structures 206 and 208. In some embodiments, the bonding structures 206 and 208 are solder bumps. In some embodiments, the bonding structures 208 are used for bonding with another element such as a printed circuit board.

In some embodiments, the circuit substrate 20 has multiple predetermined regions where no conductive feature is formed. The predetermined region may be partially removed to form one or more recesses later. The recesses may be used to contain other device elements (such as semiconductor dies) and/or other elements (such as protruding portions of a warpage-control element that will be formed later).

Many variations and/or modifications can be made to embodiments of the disclosure. In some other embodiments, the circuit substrate 20 includes two or more core portions.

In some embodiments, the circuit substrate 20 includes a high number of substrate layers.

Figure 2B:
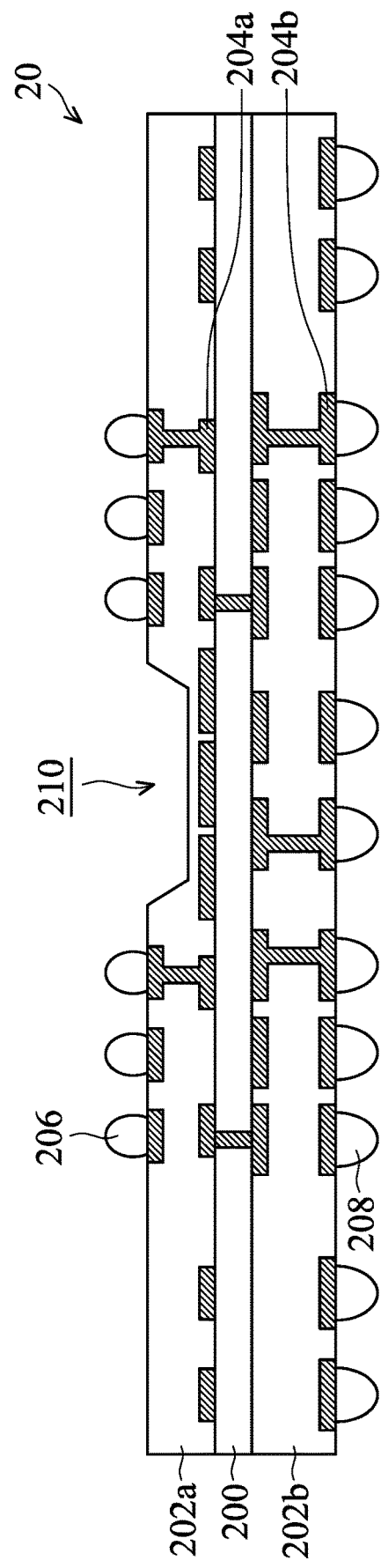

As shown in FIG. 2B, one of the predetermined regions of the circuit substrate 20 is partially removed to form a recess 210, in accordance with some embodiments. After the partial removal of the circuit substrate 20, interior sidewalls of the circuit substrate 20 are formed. The interior sidewalls of the circuit substrate 20 define the sidewalls of the recess 210, as shown in FIG. 2B. In some other embodiments, multiple recesses are formed in the circuit substrate 20.

In some embodiments, the recess 210 is formed using an energy beam drilling process. The energy beam drilling process may include a laser beam drilling process, an ion beam drilling process, an electron beam drilling process, one or more other applicable processes, or a combination thereof. The energy beam drilling process may be performed multiple times to different regions of the circuit substrate 20. As a result, the recess 210 with the designed profile is formed. In some other embodiments, the recess 210 is formed using a mechanical drilling process. For example, a computer numerical control (CNC) engraving machine may be used to form the recess 210. In some other embodiments, one or more photolithography processes and one or more etching processes are used to partially remove the circuit substrate 20, so as to form the recess 210. In some other embodiments, the circuit substrate 20 is partially removed using an energy beam drilling process, a mechanical drilling process, an etching process, one or more other applicable processes, or a combination thereof.

Many variations and/or modifications can be made to embodiments of the disclosure. In some other embodiments, the recess 210 is not formed.

Figure 2C:
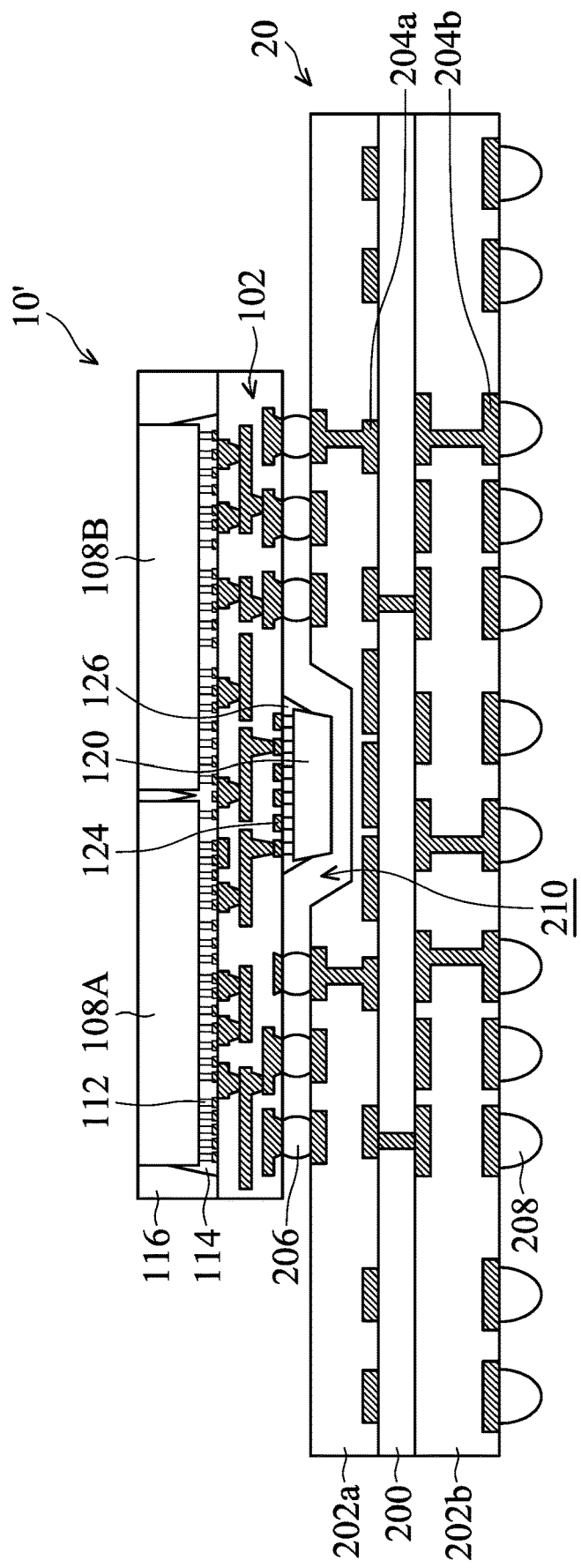

As shown in FIG. 2C, a die package 10' that is the same as or similar to the die package 10 shown in FIG. 1F is received or provided. In some embodiments, the die package 10' is picked and placed over the circuit substrate 20. Afterwards, the die package 10' is bonded to the circuit substrate 20 through the bonding structures 206. The die package 10' may be formed using the process illustrated in the embodiments in FIGS. 1A-1F. Alternatively, the die package 10' may be formed using another applicable process.

In some embodiments, the die package 10' is disposed over the circuit substrate 20 such that the conductive pads of the redistribution structure 102 are in direct contact with the bonding structures 206. In some other embodiments, additional solder elements may be formed on the conductive pads of the redistribution structure 102 before the die package 10' is disposed over the circuit substrate 20.

Afterwards, a thermal reflow process and/or a thermal compression process are used to bond the die package 10' to the circuit substrate 20. As a result, a component (such as the chip structure 120) of the die package 10' enters the recess 210, as shown in FIG. 2C. The recess 210 provides a space for partially containing the component of the die package 10'. The total height of the package structure may thus be reduced further. In some other embodiments, the component of the die package entering the recess 210 is a surface mounted device that includes, for example, resistors, capacitors, insulators, one or more other suitable devices, or a combination thereof.

Figure 2D:
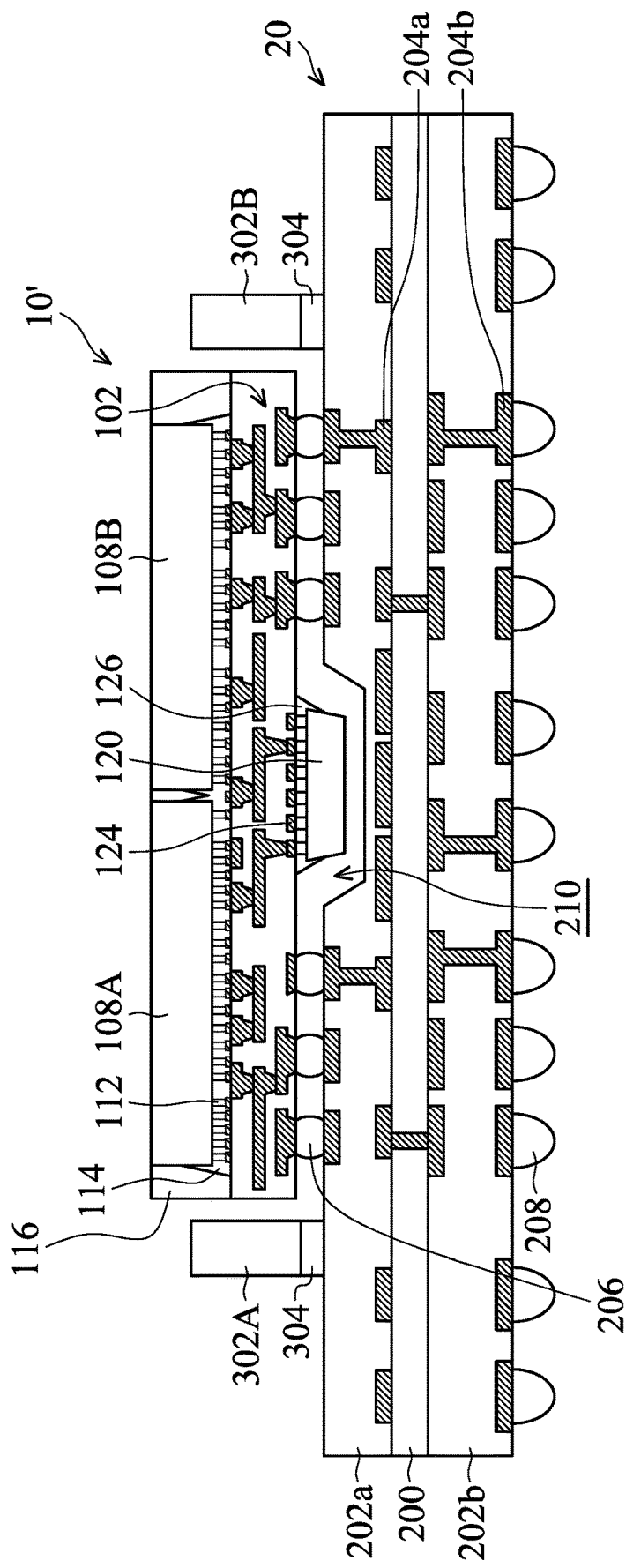

Afterwards, one or more reinforcing structures are disposed over the circuit substrate 20, in accordance with some embodiments. As shown in FIG. 2D, multiple reinforcing structures including reinforcing structures 302A and 302B are disposed over the circuit substrate 20, in accordance with some embodiments. The reinforcing structures 302A and 302B may function as support structures to improve the structural integrity of the package structure. The reinforcing structures 302A and 302B may also function as blocking structures to limit the extending area of underfill material that will be formed later.

In some embodiments, there are two more reinforcing structures 302C and 302D (not shown in FIG. 2D) are also disposed over the circuit substrate 20. The top view profiles and positions of the reinforcing structures 302A-302D will be illustrated in more detail in FIG. 4 later.

In some embodiments, the reinforcing structures 302A-302D are attached to the circuit substrate 20 through an adhesive layer (or adhesive elements) 304. The adhesive layer 304 may be made of or include an epoxy-based material, one or more other suitable materials, or a combination thereof. The thickness of the adhesive layer 304 may be in a range from about 0.05 mm to about 0.15 mm.

In some embodiments, the top surfaces of the reinforcing structures 302A and 302B are positioned at a height level that is lower than the top surface of the die package 10', as shown in FIG. 2D. In some other embodiments, the top surfaces of the reinforcing structures 302A and 302B are substantially level with the top surface of the die package 10'. In some embodiments, the ratio of the total height of the reinforcing structure 302A and the adhesive layer 304 to the total height of the die package 10' is in a range from about 0.5 to about 1.

The reinforcing structures 302A-302D may be made of or include a semiconductor material, a metal material, a ceramic material, a polymer material, one or more other suitable materials, or a combination thereof. For example, the reinforcing structures 302A-302D is made of silicon. The coefficient of thermal expansion (CTE) of the reinforcing structures 302A-302D may be in a range from about 2 ppm/degree C. to about 20 ppm/degrees C. The Young's modulus of the reinforcing structures 302A-302D may be in a range from about 40 GPa to about 200 GPa.

In the embodiments illustrated in FIGS. 2C-2D, the die package 10' is disposed over the circuit substrate 20 before the reinforcing structures 302A and 302B. However, embodiments of the disclosure are not limited thereto. Many variations and/or modifications can be made to embodiments of the disclosure. In some other embodiments, the reinforcing structures 302A and 302B are disposed over the circuit substrate 20 before the die package 10'.

Afterwards, an underfill material is dispensed onto the circuit substrate 20 along a side of the die package 10', in accordance with some embodiments. The underfill material may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof. The underfill material may be drawn into the space between the die package 10' and the circuit substrate 20 to surround some of the bonding structures 206 by the capillary force.

The underfill material is further drawn into the recess 210 and reaching another side of the die package 10' by the capillary force, in accordance with some embodiments. Similarly, the underfill material may be further drawn into the gaps between the die package 10' and the reinforcing structures 302A-302D by the capillary force, in accordance with some embodiments.

Figure 2E:
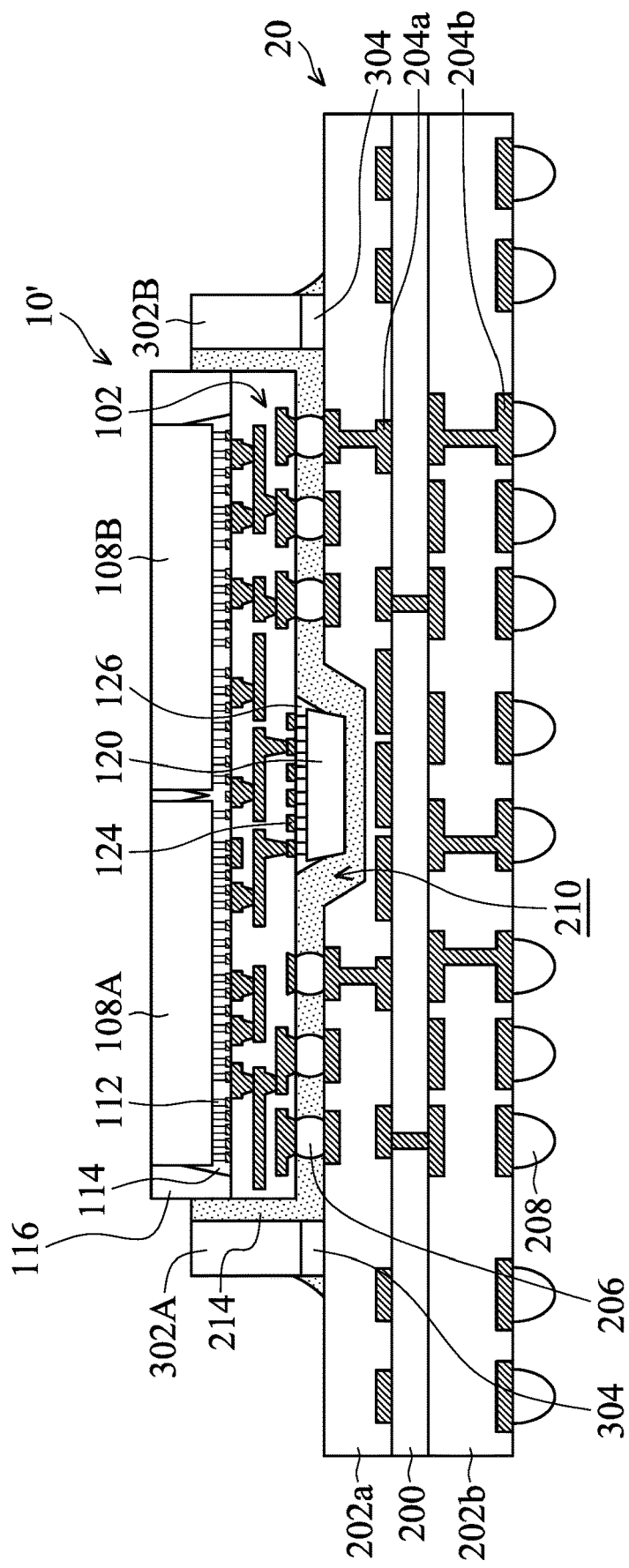

In some embodiments, the underfill material is thermally heated and cured to form an underfill structure 214. As a result, the underfill structure 214 that surrounds the bonding structures 206 and fills the recess 210 is formed, as shown in FIG. 2E. In some embodiments, the underfill structure 214 is in direct contact with the interior sidewalls of the circuit substrate 20. In some embodiments, the underfill structure 214 is in direct contact with the reinforcing structures 302A and 302B, as shown in FIG. 2E. In some embodiments, the underfill structure 214 is adjacent to the adhesive layer 304. In some embodiments, the underfill structure 214 is in direct contact with the adhesive layer 304. In some embodiments, the underfill structure 214 is in direct contact with the inner sidewalls of the reinforcing structures 302A and 302B and the sidewalls of the die package 10', as shown in FIG. 2E.

In some embodiments, a top of the upper surface of the underfill structure 214, located between the reinforcing structures 302A, 302B and the sidewalls of the die package 10', is substantially level with the upper surface of the reinforcing structures 302A and 302B, as shown in FIG. 2E. In some other embodiments, the top of the upper surface of the underfill structure 214 may be higher or lower than the upper surface of the reinforcing structures 302A and 302B.

Figure 2F:
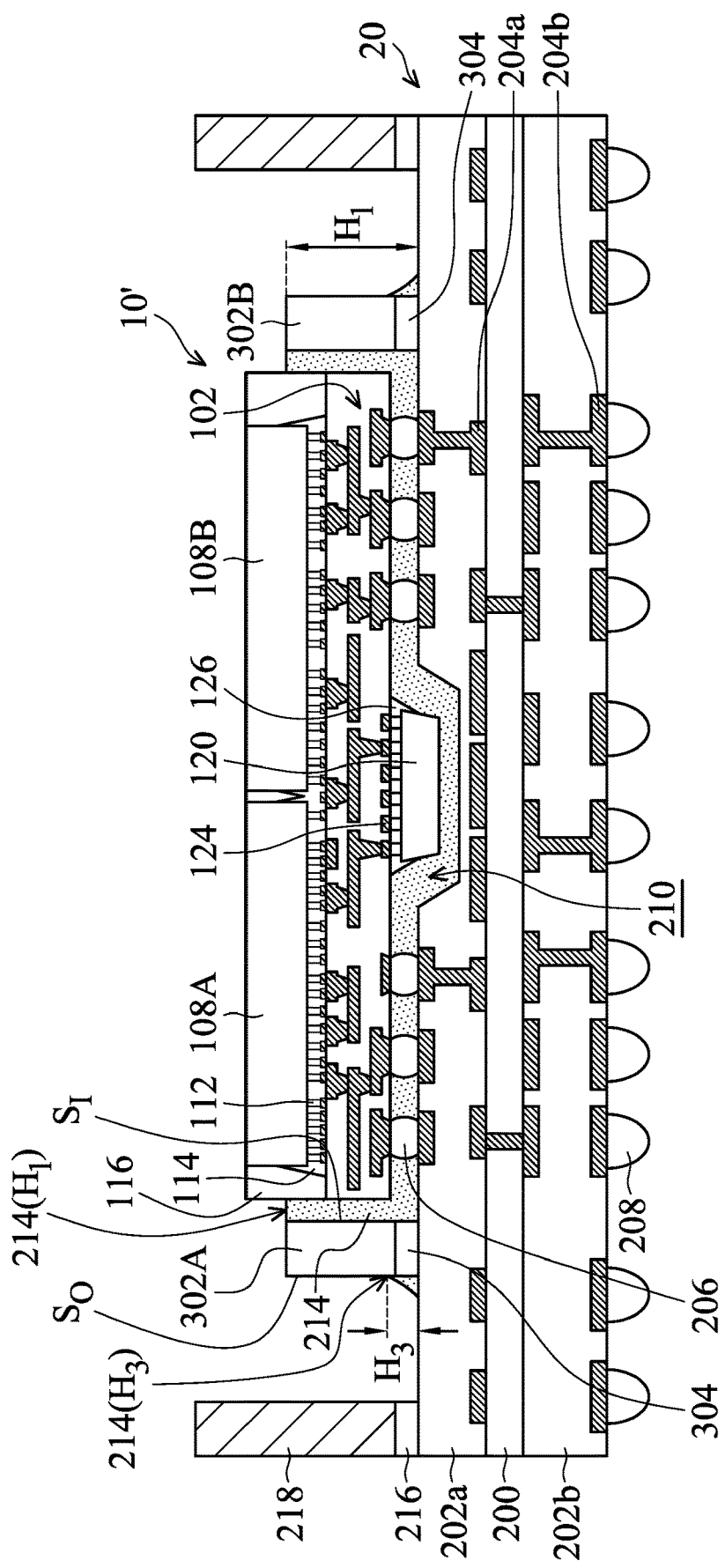

As shown in FIG. 2F, a warpage-control element 218 is disposed over the circuit substrate 20, in accordance with some embodiments. In some embodiments, the warpage-control element 218 is attached to the circuit substrate 20 through an adhesive layer 216. The adhesive layer 216 may be made of or include an epoxy-based material, one or more other suitable materials, or a combination thereof. The warpage-control element 218 may help to reduce the warpage of the circuit substrate 20 during the subsequent formation processes and/or the reliability testing processes.

In some embodiments, the outer sidewall of the warpage-control element 218 is substantially aligned with the edge of the carrier substrate 20. In some embodiments, the outer sidewall of the warpage-control element 218 and the edge of the carrier substrate 20 are substantially coplanar and together form a sidewall (such as a vertical sidewall) of the package structure.

In some embodiments, the warpage-control element 218 is made of or includes a metal material. The metal material may include aluminum, copper, steel, gold, one or more other suitable materials, or a combination thereof. In some other embodiments, the warpage-control element 218 is made of or includes a semiconductor material, a ceramic material, a polymer material, a metal material, one or more other suitable materials, or a combination thereof. In some embodiments, the warpage-control element 218 has a coefficient of thermal expansion that is similar to that of the circuit substrate 20.

In some embodiments, the warpage-control element 218 is separated from the die package 10' by a distance. In some embodiments, the warpage-control element 218 is separated from the die package 10' without being in direct contact with the die package 10'. In some embodiments, the warpage-control element 218 is separated from the underfill structure 214 without being in direct contact with the underfill structure 214. In some embodiments, the warpage-control element 218 is separated from the reinforcing structures 302A and 302B without being in direct contact with the reinforcing structures 302A and 302B, as shown in FIG. 2F.

Many variations and/or modifications can be made to embodiments of the disclosure. In some other embodiments, the warpage-control element 218 and the adhesive layer 216 are not formed.

Figure 3:
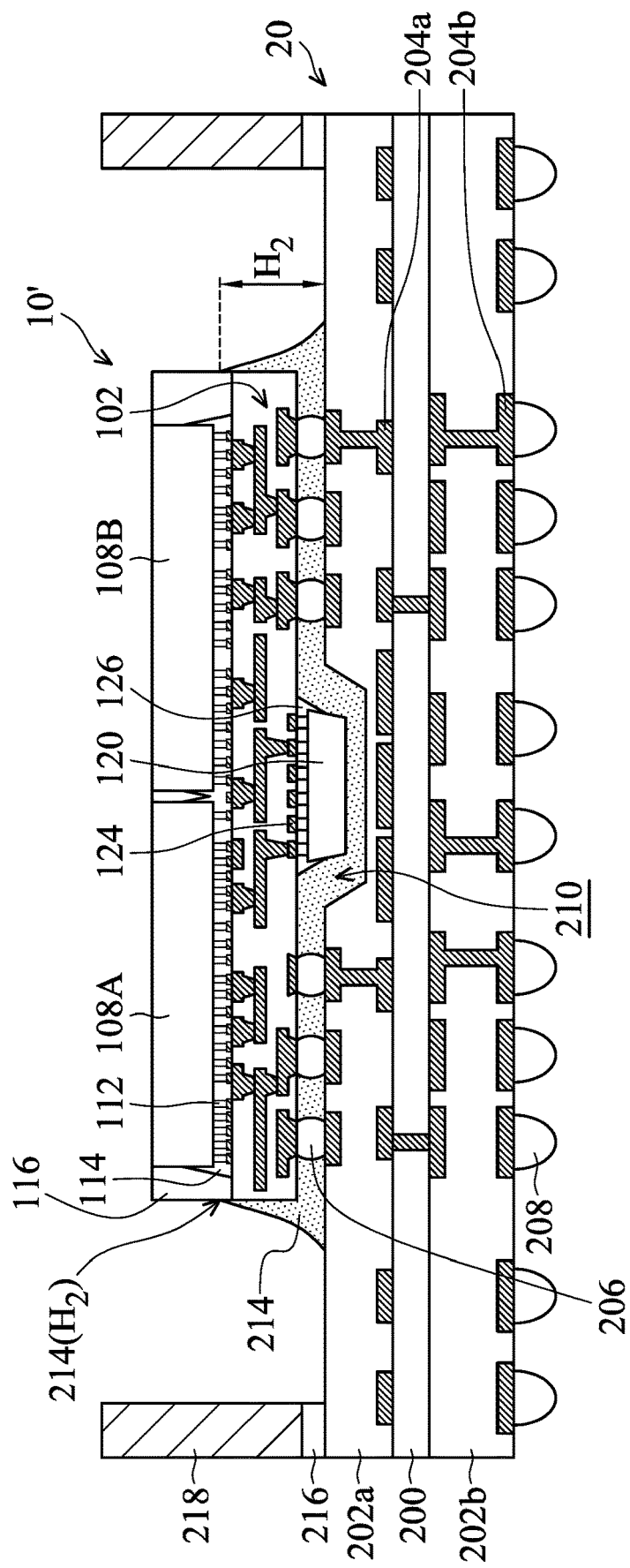
FIG. 3 is a cross-sectional view of a portion of a package structure, in accordance with some embodiments.
Figure 4:
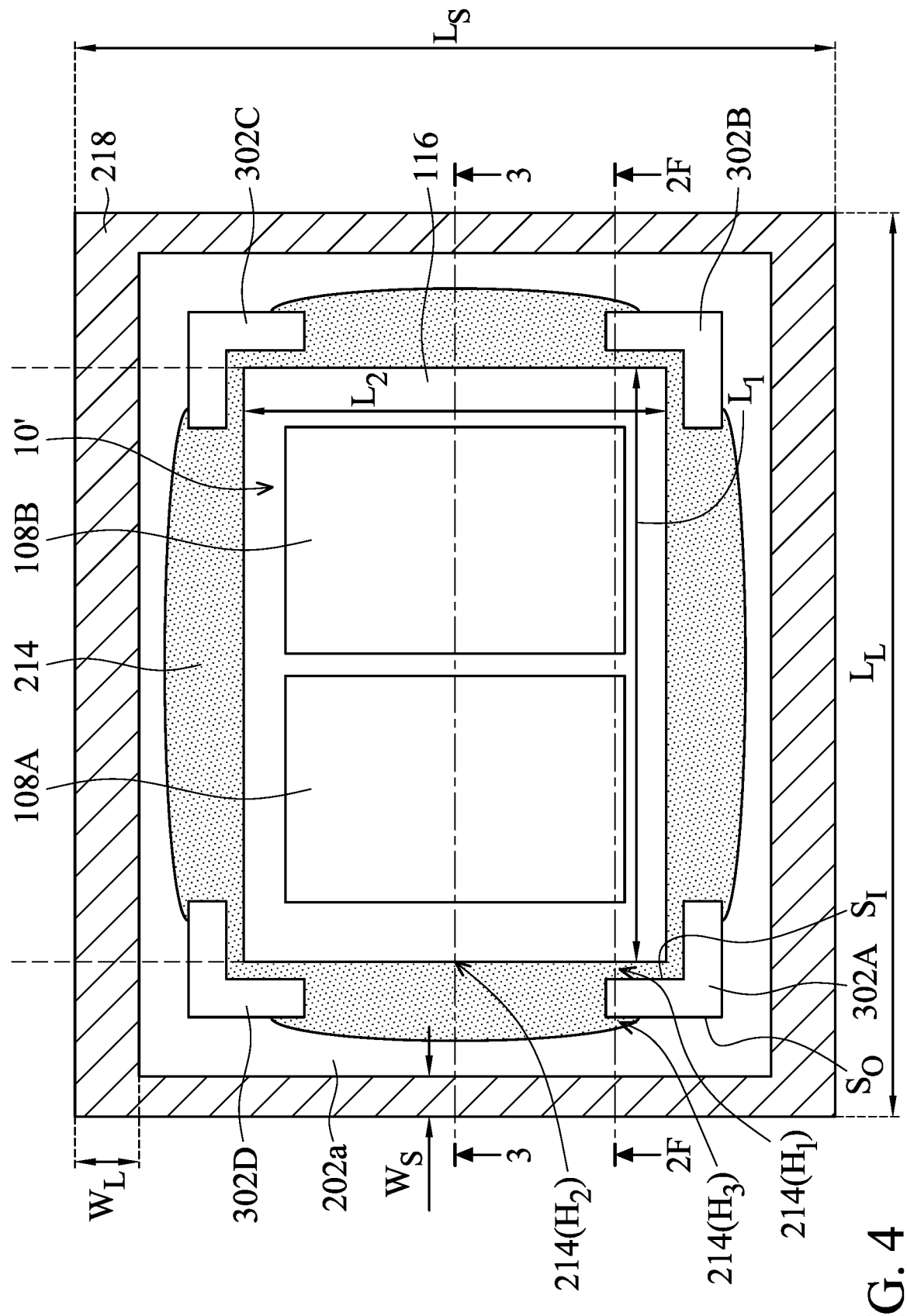
FIG. 4 is a plan view of a portion of a package structure, in accordance with some embodiments.

FIG. 3 is a cross-sectional view of a portion of a package structure, in accordance with some embodiments. FIG. 4 is a plan view of a portion of a package structure, in accordance with some embodiments. In some embodiments, FIG. 4 shows the plan view of the structure shown in FIGS. 2F and 3. In some embodiments, FIG. 2F shows the cross-sectional view of the package structure taken along the line 2F-2F in FIG. 4. In some embodiments, FIG. 3 shows the cross-sectional view of the package structure taken along the line 3-3 in FIG. 4.

In some embodiments, the warpage-control element 218 includes or is a ring structure, as shown in FIG. 4. The warpage-control element 218 surrounds a region of the circuit substrate 20 where the die package 10' is positioned. The warpage-control element 218 has an opening that exposes the region of the circuit substrate 20. In some embodiments, the warpage-control element 218 surrounds the die package 10' and the reinforcing structures 302A-302D. In some embodiments, the warpage-control element 218 continuously surrounds the die package 10' and the reinforcing structures 302A-302D, as shown in FIG. 4.

In some embodiments, the reinforcing structures 302A, 302B, 302C and 302D partially surrounds the first, the second, the third, and the fourth corners of the die package 10', respectively. In some embodiments, the reinforcing structures 302A, 302B, 302C and 302D are separated from each other, as shown in FIGS. 2F and 4. In some embodiments, each of the reinforcing structures 302A to 302D has an L-shape or L-like shape top view profile.

Many variations and/or modifications can be made to embodiments of the disclosure. The top view profile of the reinforcing structures 302A to 302D may have other shapes. For example, each of the reinforcing structures 302A to 302D may have a square top view profile, a rectangular top view profile, a circle top view profile, an oval top view profile, a C-shape top view profile, a C-like shape top view profile, or another suitable top view profile.

Due to the coefficient of thermal expansion (CTE) mismatch between the circuit substrate 20 and the die package 10', high stress may be generated near the corners of the die package 10'. As a result, the corners of the die package 10' (i.e., the portions of the protective layer 116 at the corners) may be exposed to high crack risk during the reliability test and/or the future operation, especially for the large package module. In some embodiments, the reinforcing structures 302A-302D provide additional support to the portions of the protective layer 116 near the corners of the die package 10'. The reinforcing structures 302A-302D are used to ensure good structural integrity of the die package 10'. The crack risk of the protective layer 116 is significantly reduced. The performance and reliability of the package structure are greatly improved.

As shown in FIG. 4, each of the reinforcing structures 302A-302D has an inner sidewall $S_I$ and an outer sidewall $S_O$. The inner sidewall $S_I$ is between the outer sidewall $S_O$ and the die package 10'. The inner sidewall $S_I$ faces the die package 10'. As shown in FIG. 4, the die package 10' has a first sidewall and a second sidewall that intersect at a corner that is partially surrounded by the reinforcing structure 302A. In some embodiments, the inner sidewall $S_I$ of the reinforcing structure 302A faces the first sidewall and the second sidewall of the die package 10', as shown in FIG. 4.

As shown in FIGS. 2F and 4, the underfill structure 214 has a first portion $214(H_1)$ that has a thickness $H_1$. The first portion $214(H_1)$ is between the die package 10' and the reinforcing structure 302A. The first portion $214(H_1)$ fills the gap between the reinforcing structure 302A and the die package 10'. In some embodiments, the inner sidewall $S_I$ of the reinforcing structure 302A or 302B is completely covered by the underfill structure 214. In some embodiments, the top surface of the first portion $214(H_1)$ is substantially level with the top surface of the reinforcing structure 302A.

In these cases, the thickness $H_1$ of the first portion 214($H_1$) is substantially equal to the total height of the reinforcing structure 302A and the adhesive layer 304. The thickness $H_1$ may be in a range from about 0.25 mm to about 0.75 mm.

Many variations and/or modifications can be made to embodiments of the disclosure. In some other embodiments, the underfill structure 214 extends across the top surfaces of the reinforcing structures 302A and 302B. In these cases, the first portion 214($H_1$) is higher than the top surface of the reinforcing structure 302A.

As shown in FIGS. 3 and 4, the underfill structure 214 has a second portion 214($H_2$) that has a thickness $H_2$. The second portion 214($H_2$) is adjacent to the sidewall of the die package 10'. The thickness $H_2$ may be in a range from about 0.25 mm to about 0.75 mm. In some embodiments, the first portion 214($H_1$) is thicker than the second portion 214($H_2$). In these cases, the thickness $H_2$ may be in a range from about 0.15 mm to about 0.65 mm.

As shown in FIGS. 2F and 4, the underfill structure 214 has a third portion 214($H_3$) that has a thickness $H_3$. The third portion 214($H_3$) is adjacent to the outer sidewall $S_O$ of the reinforcing structure 302A. In some embodiments, the second portion 214($H_2$) is thicker than the third portion 214($H_3$).

As shown in FIG. 4, the underfill structure 214 laterally extends exceeding (or extends past) the inner sidewalls $S_I$ of the reinforcing structures 302A-302D, in accordance with some embodiments. In some embodiments, the underfill structure 214 laterally extends exceeding the inner sidewalls $S_I$ and the outer sidewalls $S_O$ of the reinforcing structures 302A-302D, as shown in FIG. 4.

As shown in FIGS. 2F and 4, the outer sidewall $S_O$ of the reinforcing structures 302A-302D are partially covered by the underfill structure 214, in accordance with some embodiments. In some embodiments, a first part of the outer sidewall $S_O$ is covered by the third portion 214($H_3$) of the underfill structure 214. In some embodiments, a second part of the outer sidewall $S_O$ is not reached by the underfill structure 214, as shown in FIG. 4.

As shown in FIG. 4, the die package 10' has a first side that extends in the first direction (such as the horizontal direction) and a second side that extends in the second direction (such as the vertical direction). The first side has a length $L_1$, and the second side has a length $L_2$. In some embodiments, the first side is longer than the second side.

As shown in FIG. 4, the warpage-control element 218 has a first portion that extends in the first direction (such as the horizontal direction). The first portion of the warpage-control element 218 has a length $L_L$ and a width $W_L$, as shown in FIG. 4. The warpage-control element 218 has a second portion that extends in the second direction (such as the vertical direction). The second portion of the warpage-control element 218 has a length $L_S$ and a width $W_S$. In some embodiments, the first direction is substantially perpendicular to the second direction. In some embodiments, the length $L_L$ is greater than the length $L_S$. In some embodiments, the width $W_L$ is greater than the width $W_S$.

Because the first side of the die package 10' is longer than the second side of the die package 10', the stress on the circuit substrate 20 in the first direction might be relatively high. The wider first portion of the warpage-control element 218 may have a greater strength to reduce the warpage of the entire package structure.

Figure 5:
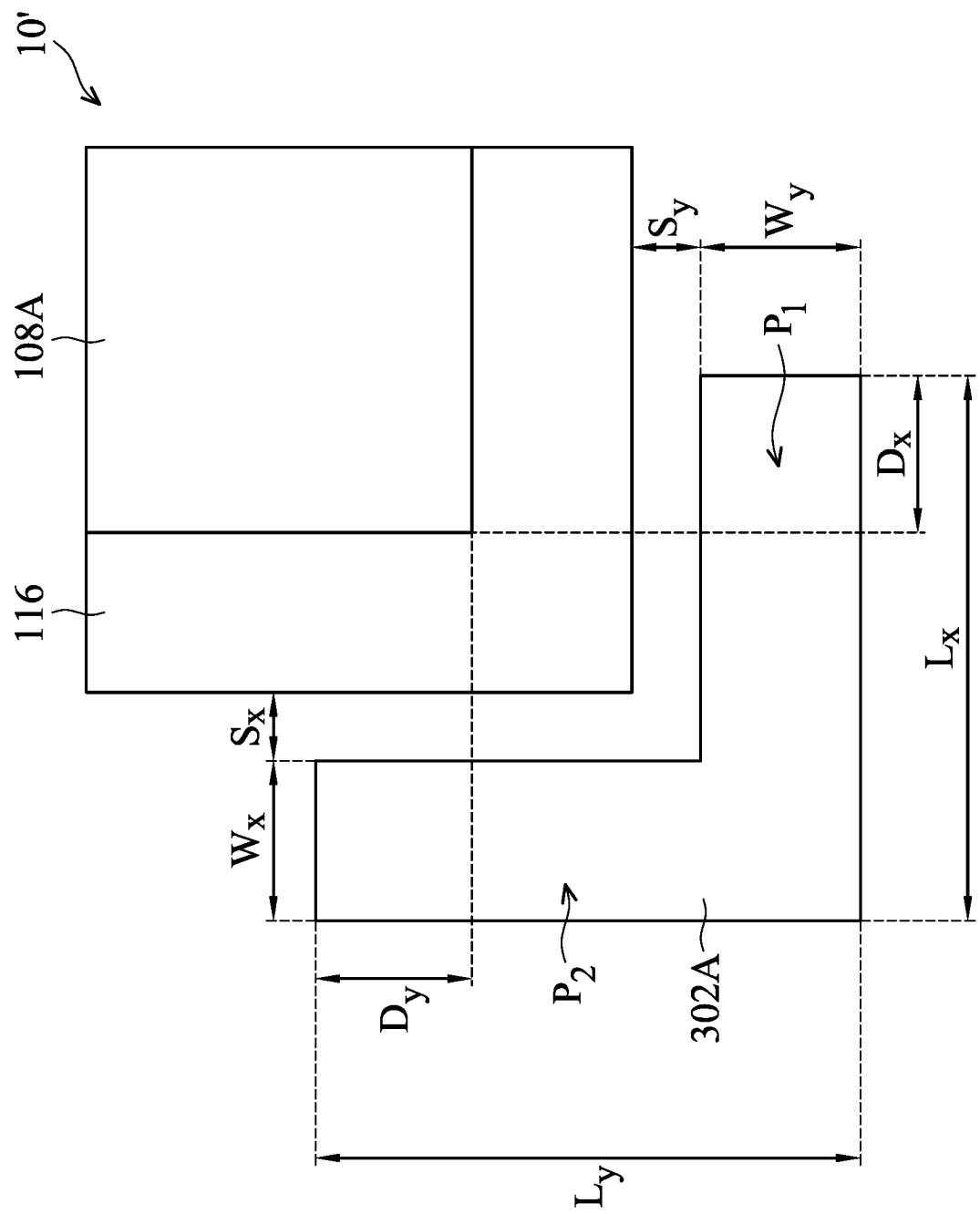
FIG. 5 is a plan view of a portion of a package structure, in accordance with some embodiments.

FIG. 5 is a plan view of a portion of a package structure, in accordance with some embodiments. In some embodiments, FIG. 5 is an enlarged plan view showing the top view of the reinforcing structure 302A and a portion of the die package 10' near the reinforcing structure 302A.

As shown in FIG. 5, the reinforcing structure 302A has a first portion $P_1$ extending in the first direction (such as the x-direction) and a second portion $P_2$ extending in the second direction (such as the y-direction). The first portion $P_1$ has a length $L_x$, and the second portion $P_2$ has a length $L_y$. In some embodiments, the first portion $P_1$ is substantially as long as the second portion $P_2$. The length $L_x$ is substantially equal to the length $L_y$. In some other embodiments, the lengths $L_x$ and $L_y$ of the first portion $P_1$ and the second portion $P_2$ are different from each other. Each of the lengths $L_x$ and $L_y$ may be in a range from about 4 mm to about 10 mm.

As shown in FIG. 5, the first portion $P_1$ of the reinforcing structure 302A has a width $W_y$, and the second portion $P_2$ of the reinforcing structure 302A has a width $W_x$. In some embodiments, the first portion $P_1$ is substantially as wide as the second portion $P_2$. The width $W_x$ is substantially equal to the width $W_y$. In some other embodiments, the widths $W_x$ and $W_y$ are different from each other. Each of the widths $W_x$ and $W_y$ may be in a range from about 2 mm to about 5 mm.

As shown in FIG. 5, the first portion $P_1$ is spaced apart from the die package 10' by a distance $S_y$, and the second portion $P_2$ is spaced apart from the die package 10' by a distance $S_x$. In some embodiments, the distance $S_x$ is substantially equal to the distance $S_y$. In some other embodiments, the distances $S_x$ and $S_y$ are different from each other. Each of the distances $S_x$ and $S_y$ may be in a range from about 0.1 mm to about 0.25 mm.

As shown in FIG. 5, the first portion $P_1$ of the reinforcing structure 302A extends exceeding an edge of the chip structure 108A and laterally overlaps a portion of the chip structure 108A. The part of the first portion $P_1$ overlapping the chip structure 108A has a length $D_x$, as shown in FIG. 5. As shown in FIG. 5, the second portion $P_2$ of the reinforcing structure 302A extends exceeding another edge of the chip structure 108A and laterally overlaps another portion of the chip structure 108A. The part of the second portion $P_2$ overlapping the chip structure 108A has a length $D_y$, as shown in FIG. 5. In some embodiments, the length $D_x$ is substantially equal to the length $D_y$. In some other embodiments, the lengths $D_x$ and $D_y$ are different from each other. Each of the lengths $D_x$ and $D_y$ may be in a range from about 1 mm to about 2 mm.

Figure 6:
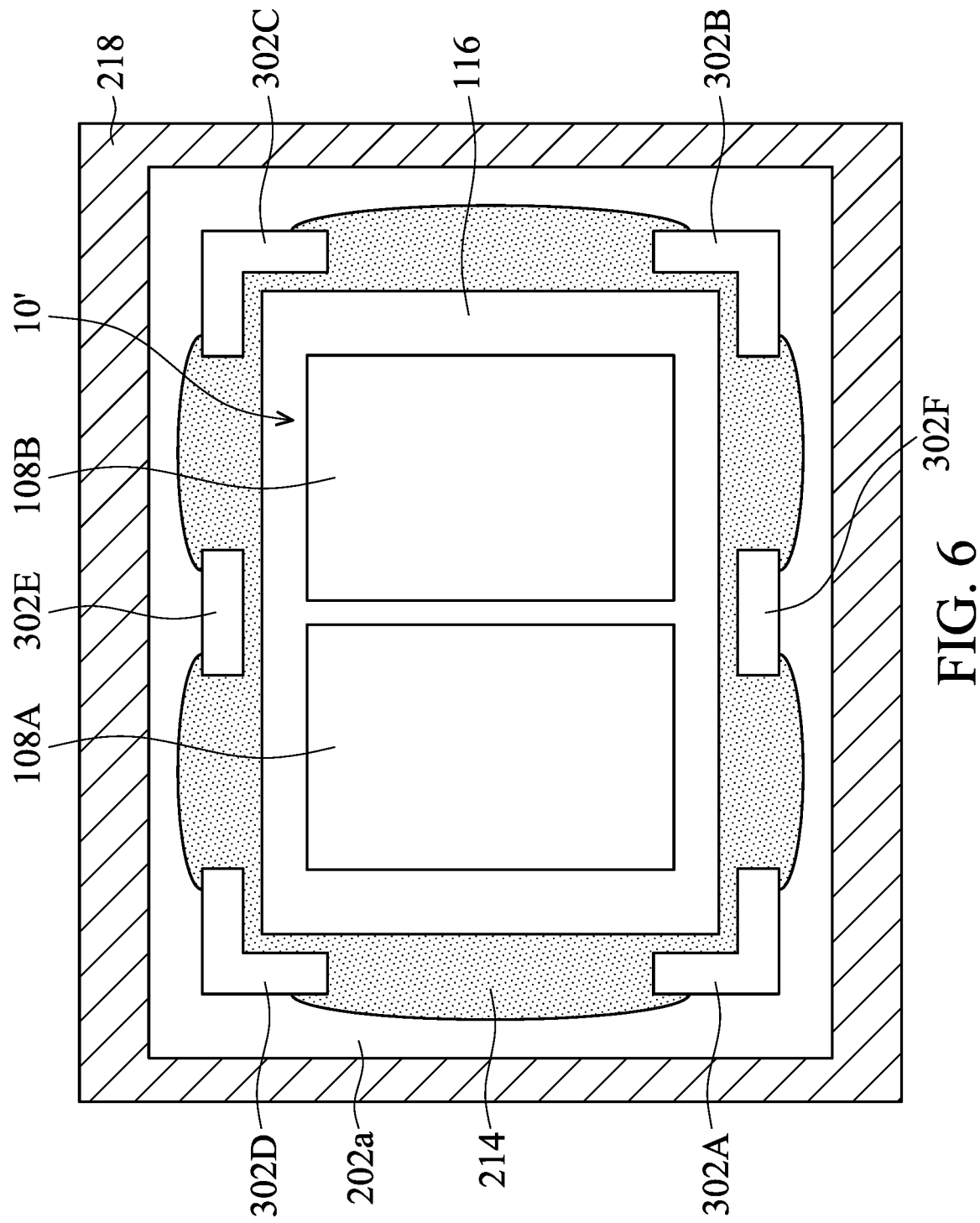
FIG. 6 is a plan view of a portion of a package structure, in accordance with some embodiments.

Many variations and/or modifications can be made to embodiments of the disclosure. FIG. 6 is a plan view of a portion of a package structure, in accordance with some embodiments. Similar to the embodiments illustrated in FIG. 4, the reinforcing structures 302A-302D partially surround the corners of the die package 10'. In some embodiments, there are additional reinforcing structures 302E and 302F disposed over the insulating layer 202a of the circuit substrate 20. In some embodiments, each of the reinforcing structures 302E and 302F laterally extends across a gap between the chip structures 108A and 108B. Each of the reinforcing structures 302E and 302F laterally extends exceeding opposite sides of the chip structures 108A and 108B in the plan view, as shown in FIG. 6. Due to the support of the reinforcing structures 302E and 302F, the crack risk of the portion of the protective layer 116 in the gap between the chip structures 108A and 108B may be significantly reduced.

In the embodiments illustrated in FIGS. 4 and 6, each of the corners of the die package 10' is partially surrounded by a reinforcing structure. However, embodiments of the disclosure are not limited thereto. Many variations and/or modifications can be made to embodiments of the disclosure. In some other embodiments, two or more reinforcing structures are together used to partially surround each of the corners of the die package 10'.

Figure 7:
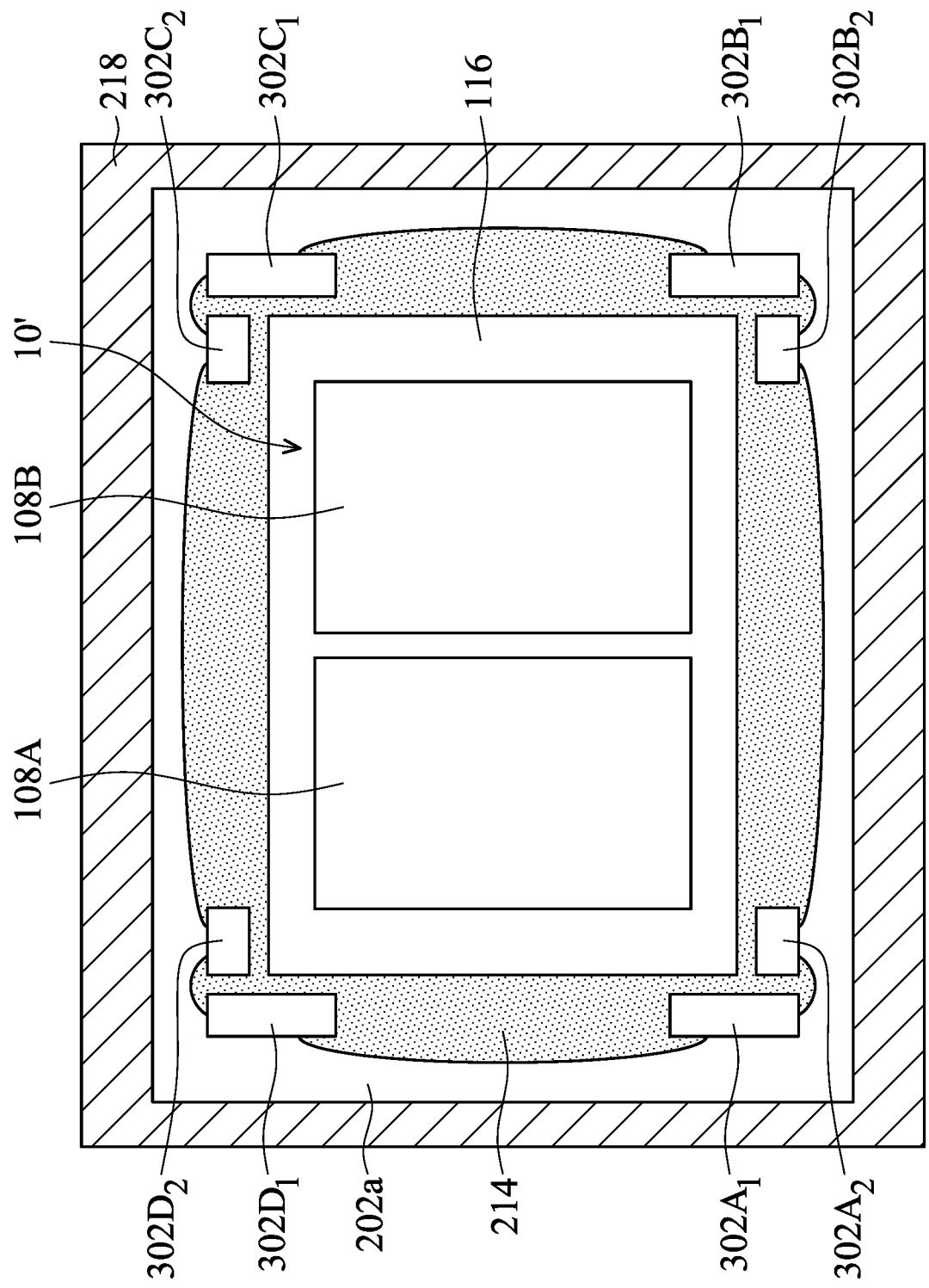
FIG. 7 is a plan view of a portion of a package structure, in accordance with some embodiments.

FIG. 7 is a plan view of a portion of a package structure, in accordance with some embodiments. In some embodiments, reinforcing structures 302A$_1$ and 302A$_2$ are disposed over the insulating layer 202a of the circuit substrate 20. The reinforcing structures 302A$_1$ and 302A$_2$ together partially surround a first corner of the die package 10'. In some embodiments, the sizes and/or top view profiles of the reinforcing structures 302A$_1$ and 302A$_2$ are different from each other. However, embodiments of the disclosure are not limited thereto. In some other embodiments, the sizes or top view profiles of the reinforcing structures 302A$_1$ and 302A$_2$ are substantially identical.

In some embodiments, reinforcing structures 302B$_1$, 302B$_2$, 302C$_1$, 302C$_2$, 302D$_1$, and 302D$_2$ are disposed over the insulating layer 202a of the circuit substrate 20, as shown in FIG. 7. The reinforcing structures 302B$_1$ and 302B$_2$ together partially surround a second corner of the die package 10'. The reinforcing structures 302C$_1$ and 302C$_2$ together partially surround a third corner of the die package 10'. The reinforcing structures 302D$_1$ and 302D$_2$ together partially surround a fourth corner of the die package 10'.

In some embodiments, the sizes and/or top view profiles of the reinforcing structures 302A$_1$, 302A$_2$, 302B$_1$, 302B$_2$, 302C$_1$, 302C$_2$, 302D$_1$, and 302D$_2$ are different from each other. However, embodiments of the disclosure are not limited thereto. In some other embodiments, the sizes or top view profiles of the reinforcing structures 302A$_1$, 302A$_2$, 302B$_1$, 302B$_2$, 302C$_1$, 302C$_2$, 302D$_1$, and 302D$_2$ are substantially identical.

Figure 8:
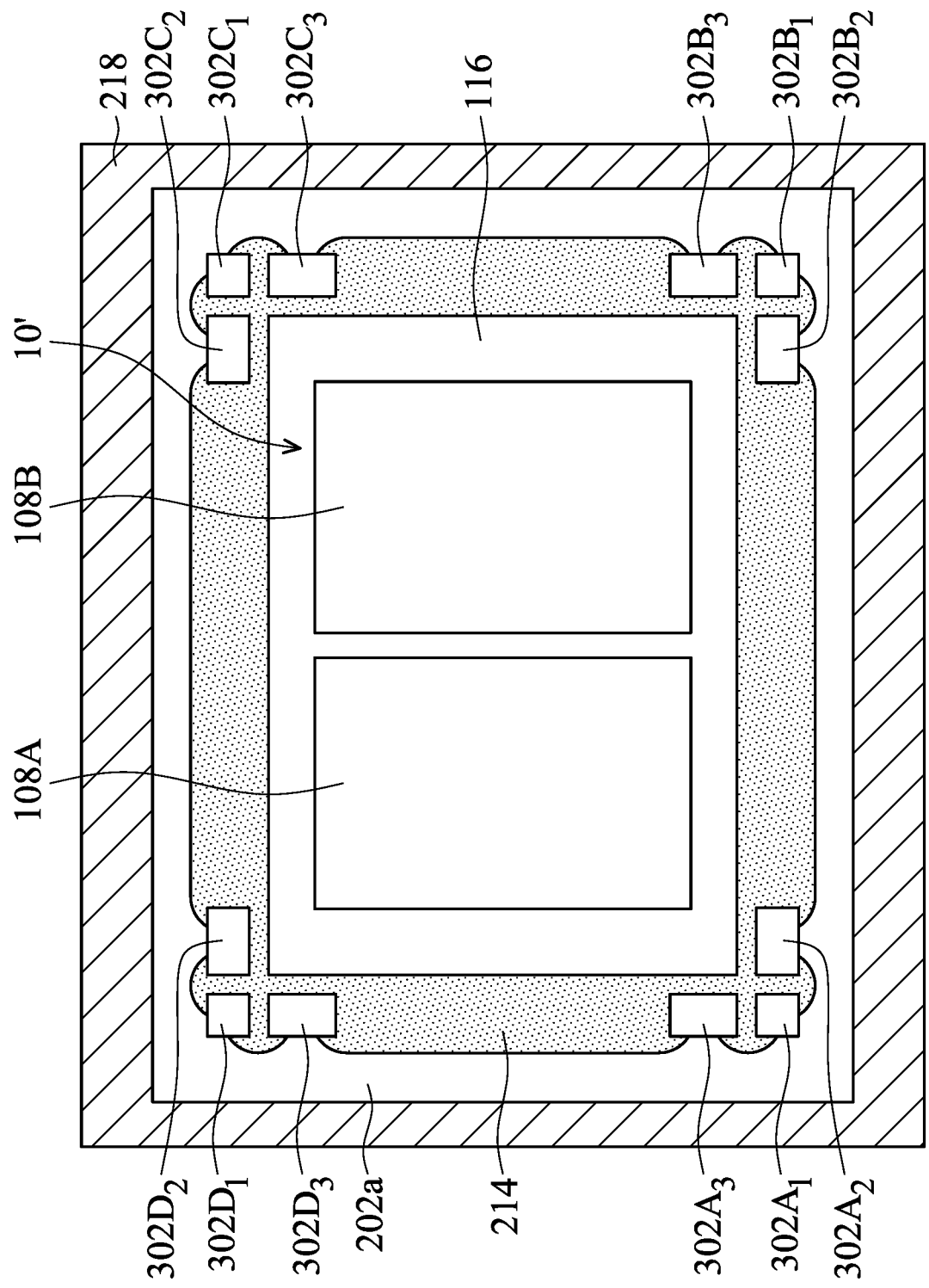
FIG. 8 is a plan view of a portion of a package structure, in accordance with some embodiments.

Many variations and/or modifications can be made to embodiments of the disclosure. In some other embodiments, three or more reinforcing structures are together used to partially surround each of the corners of the die package 10'. FIG. 8 is a plan view of a portion of a package structure, in accordance with some embodiments.

In some embodiments, reinforcing structures 302A$_1$, 302A$_2$, and 302A$_3$ are disposed over the insulating layer 202a of the circuit substrate 20, as shown in FIG. 8. The reinforcing structures 302A$_1$ to 302A$_3$ together partially surround the first corner of the die package 10'. In some embodiments, the sizes and/or top view profiles of the reinforcing structures 302A$_1$ to 302A$_3$ are different from each other. However, embodiments of the disclosure are not limited thereto. In some other embodiments, the sizes or top view profiles of the reinforcing structures 302A$_1$ to 302A$_3$ are substantially identical. In some embodiments, the sizes and/or top view profiles of two of the reinforcing structures 302A$_1$ to 302A$_3$ are substantially identical.

In some embodiments, reinforcing structures 302B$_1$, 302B$_2$, 302B$_3$, 302C$_1$, 302C$_2$, 302C$_3$, 302D$_1$, 302D$_2$, and 302D$_3$ are disposed over the insulating layer 202a of the circuit substrate 20, as shown in FIG. 8. The reinforcing structures 302B$_1$ to 302B$_3$ together partially surround the second corner of the die package 10'. The reinforcing structures 302C$_1$ to 302C$_3$ together partially surround the third corner of the die package 10'. The reinforcing structures 302D$_1$ to 302D$_3$ together partially surround the fourth corner of the die package 10'.

In some embodiments, the sizes and/or top view profiles of the reinforcing structures 302A$_1$, 302A$_2$, 302A$_3$, 302B$_1$, 302B$_2$, 302B$_3$, 302C$_1$, 302C$_2$, 302C$_3$, 302D$_1$, 302D$_2$, and 302D$_3$ are different from each other. However, embodiments of the disclosure are not limited thereto. In some other embodiments, the sizes or top view profiles of the reinforcing structures 302A$_1$, 302A$_2$, 302A$_3$, 302B$_1$, 302B$_2$, 302B$_3$, 302C$_1$, 302C$_2$, 302C$_3$, 302D$_1$, 302D$_2$, and 302D$_3$ are substantially identical. In some other embodiments, the sizes or top view profiles of some of the reinforcing structures 302A$_1$, 302A$_2$, 302A$_3$, 302B$_1$, 302B$_2$, 302B$_3$, 302C$_1$, 302C$_2$, 302C$_3$, 302D$_1$, 302D$_2$, and 302D$_3$ are substantially identical.

In the embodiments illustrated in FIGS. 2A-2F, the reinforcing structures are attached to the circuit substrate 20 through the adhesive layer 304. However, embodiments of the disclosure are not limited thereto. Many variations and/or modifications can be made to embodiments of the disclosure. In some other embodiments, the reinforcing structures are bonded to the circuit substrate 20 through bonding structures such as solder bumps.

Figure 9A:
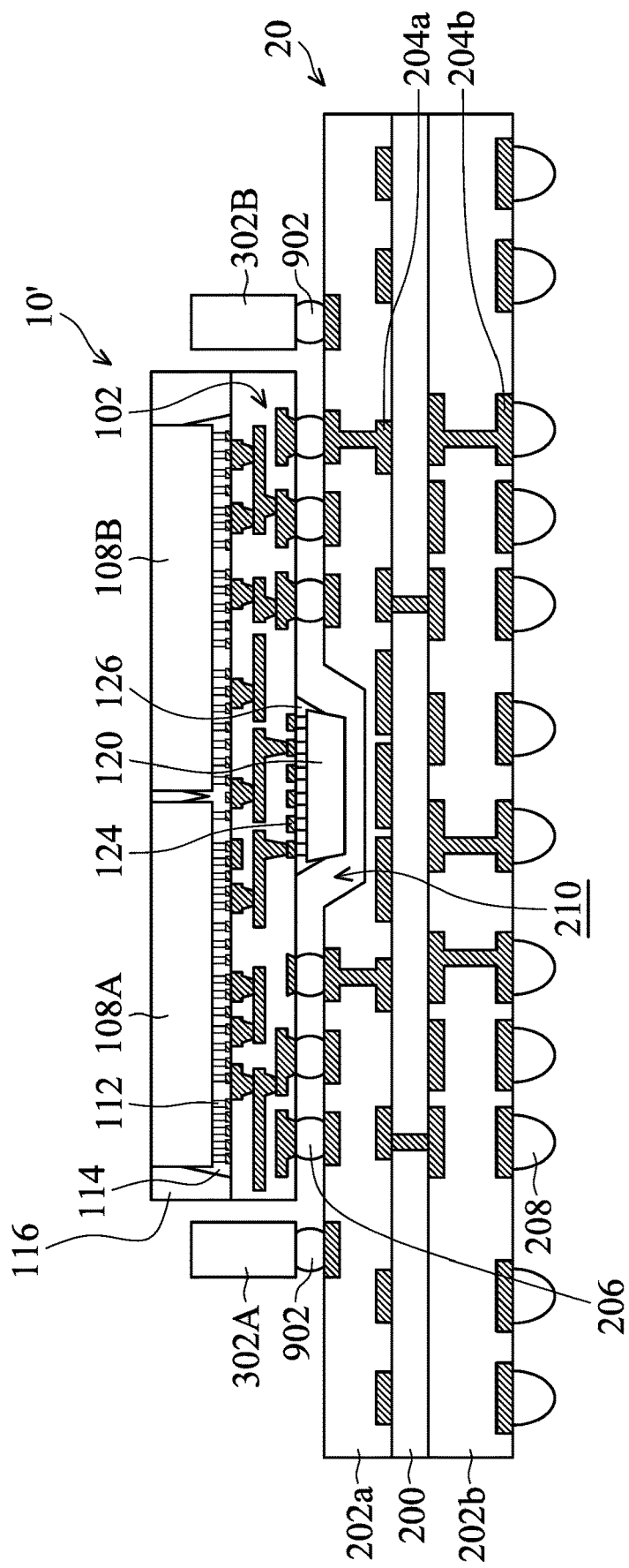
FIGS. 9A-9C are cross-sectional views of various stages of a process for forming a portion of a package structure, in accordance with some embodiments.
Figure 9B:
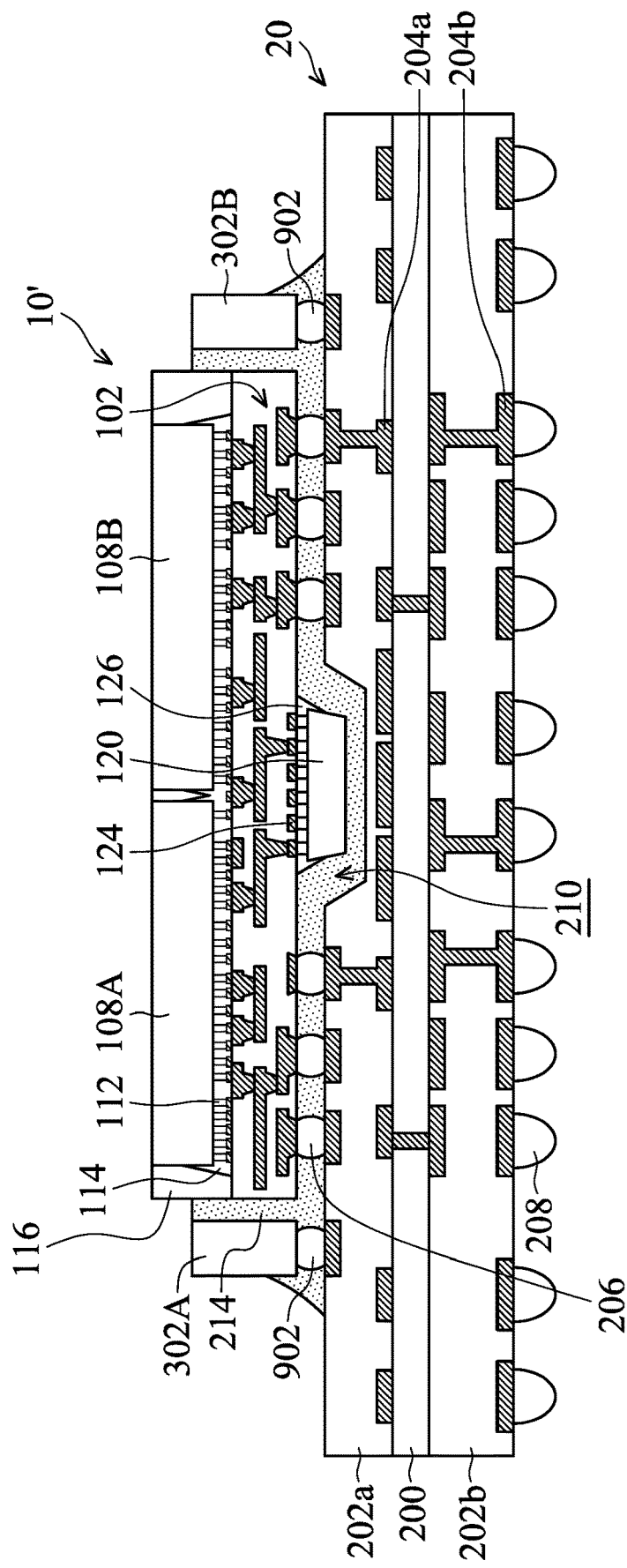
Figure 9C:
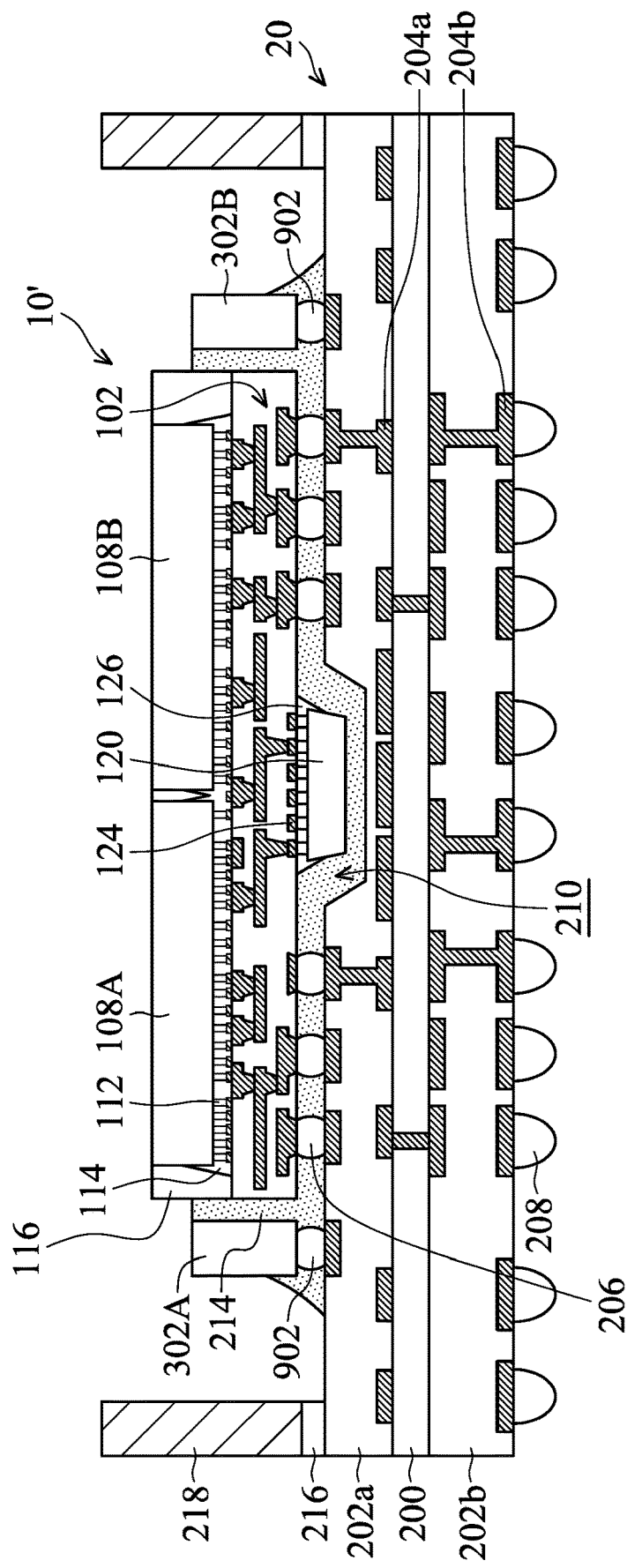

FIGS. 9A-9C are cross-sectional views of various stages of a process for forming a portion of a package structure, in accordance with some embodiments. In some embodiments, a structure the same as or similar to the structure shown in FIG. 2C is formed or obtained. Afterwards, multiple reinforcing structures including the reinforcing structures 302A and 302B are bonded to the circuit substrate 20 through bonding structures 902, as shown in FIG. 9A in accordance with some embodiments. In some embodiments, each of the reinforcing structures 302A and 302B are bonded to the circuit substrate 20 through one bonding structure 902. In some other embodiments, each of the reinforcing structures 302A and 302B are bonded to the circuit substrate 20 through two or more bonding structure 902.

In some embodiments, the bonding structures 902 include solder bumps. In some embodiments, the bonding structures 902 are tin-containing solder bumps. The tin-containing solder bumps may further include copper, silver, gold, aluminum, lead, one or more other suitable materials, or a combination thereof. In some other embodiments, the bonding structures 902 are lead-free. In some embodiments, solder materials are disposed over the bottoms of the reinforcing structures 302A and 302B and/or the top surfaces of some of the conductive features 204a before the reinforcing structures 302A and 302B are placed over the circuit substrate 20. Afterwards, the reinforcing structures 302A and 302B are placed over the circuit substrate 20, and a thermal reflow process is performed. As a result, the solder materials are reflowed to form the bonding structures 902, as shown in FIG. 9A.

As shown in FIG. 9B, similar to the embodiments illustrated in FIG. 2E, the underfill structure 214 is formed, in accordance with some embodiments. In some embodiments, the underfill structure 214 surrounds the bonding structures 902 and 206, as shown in FIG. 9B.

As shown in FIG. 9C, similar to the embodiments illustrated in FIGS. 2F and 3, the warpage-control element 218 is attached to the circuit substrate 20 through the adhesive layer 216, in accordance with some embodiments. In some embodiments, the warpage-control element 218 is a ring structure. In some embodiments, the warpage-control element 218 continuously surrounds the die package 10', the bonding structures 902, and the reinforcing structures 302A and 302B.

In the embodiments illustrated in FIGS. 2F, 4, 6, 7, 8, and 9C, the underfill structure 214 extends into the gaps between the reinforcing structures and the die package 10'. However, embodiments of the disclosure are not limited thereto. Many variations and/or modifications can be made to embodiments of the disclosure. In some other embodiments, the underfill structure 214 does not extend into the gaps between the reinforcing structures and the die package 10'.

Figure 10A:
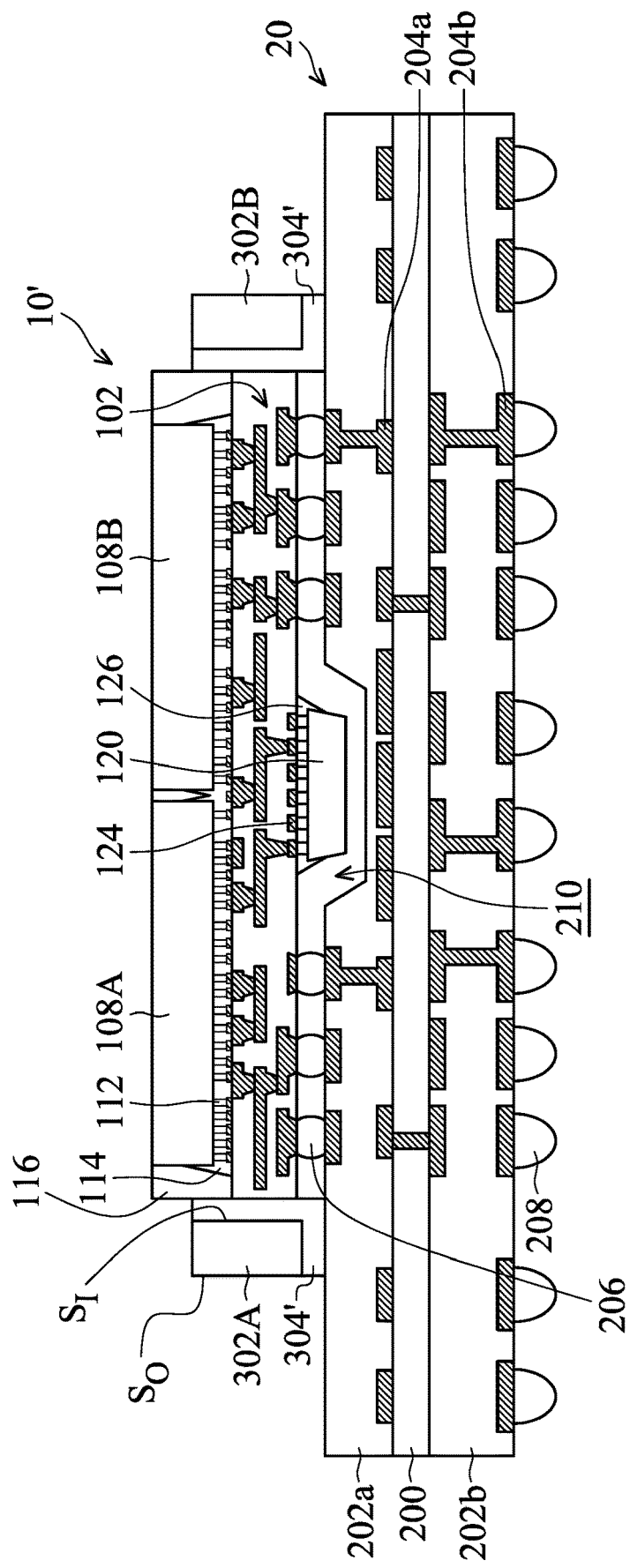
FIGS. 10A-10B are cross-sectional views of various stages of a process for forming a portion of a package structure, in accordance with some embodiments.
Figure 10B:
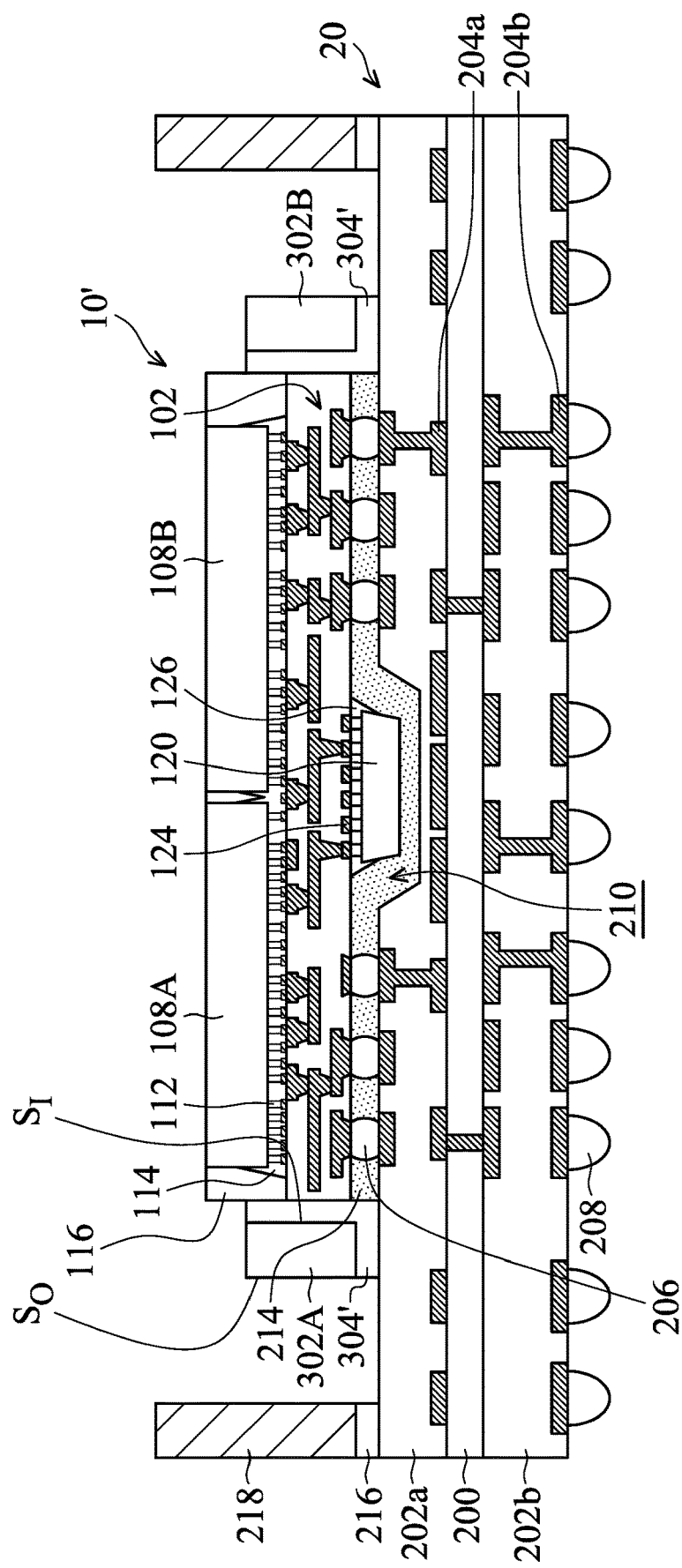

FIGS. 10A-10B are cross-sectional views of various stages of a process for forming a portion of a package structure, in accordance with some embodiments. As shown in FIG. 10A, similar to the embodiments illustrated in FIG. 2D, the reinforcing structures 302A and 302B are attached to the circuit substrate 20 through adhesive layers (or adhesive elements) 304'. In some embodiments, the adhesive layers 304' extend along the bottom surfaces and the inner sidewalls $S_I$ of the reinforcing structures 302A and 302B.

In some embodiments, the adhesive layers 304' are in direct contact with the inner sidewalls $S_I$ of the reinforcing structures 302A and 302B. In some embodiments, the adhesive layers 304' are further in direct contact with the die package 10', as shown in FIG. 10A. In some embodiments, the adhesive layers 304' are in direct contact with the protective layer 116 and the redistribution structure 102 of the die package 10'. In some embodiments, the adhesive layers 304' completely fill the gaps between the die package 10' and the reinforcing structures 302A and 302B.

As shown in FIG. 10B, similar to the embodiments illustrated in FIG. 2E, the underfill structure 214 is formed, in accordance with some embodiments. In some embodiments, the underfill structure 214 surrounds the bonding structures 206 and fills the recess 210, as shown in FIG. 10B.

Afterwards, similar to the embodiments illustrated in FIGS. 2F, 3, and 9C, the warpage-control element 218 is attached to the circuit substrate 20 through the adhesive layer 216, as shown in FIG. 10B in accordance with some embodiments. In some embodiments, the warpage-control element 218 is a ring structure. In some embodiments, the warpage-control element 218 continuously surrounds the die package 10' and the reinforcing structures 302A and 302B.

Figure 11:
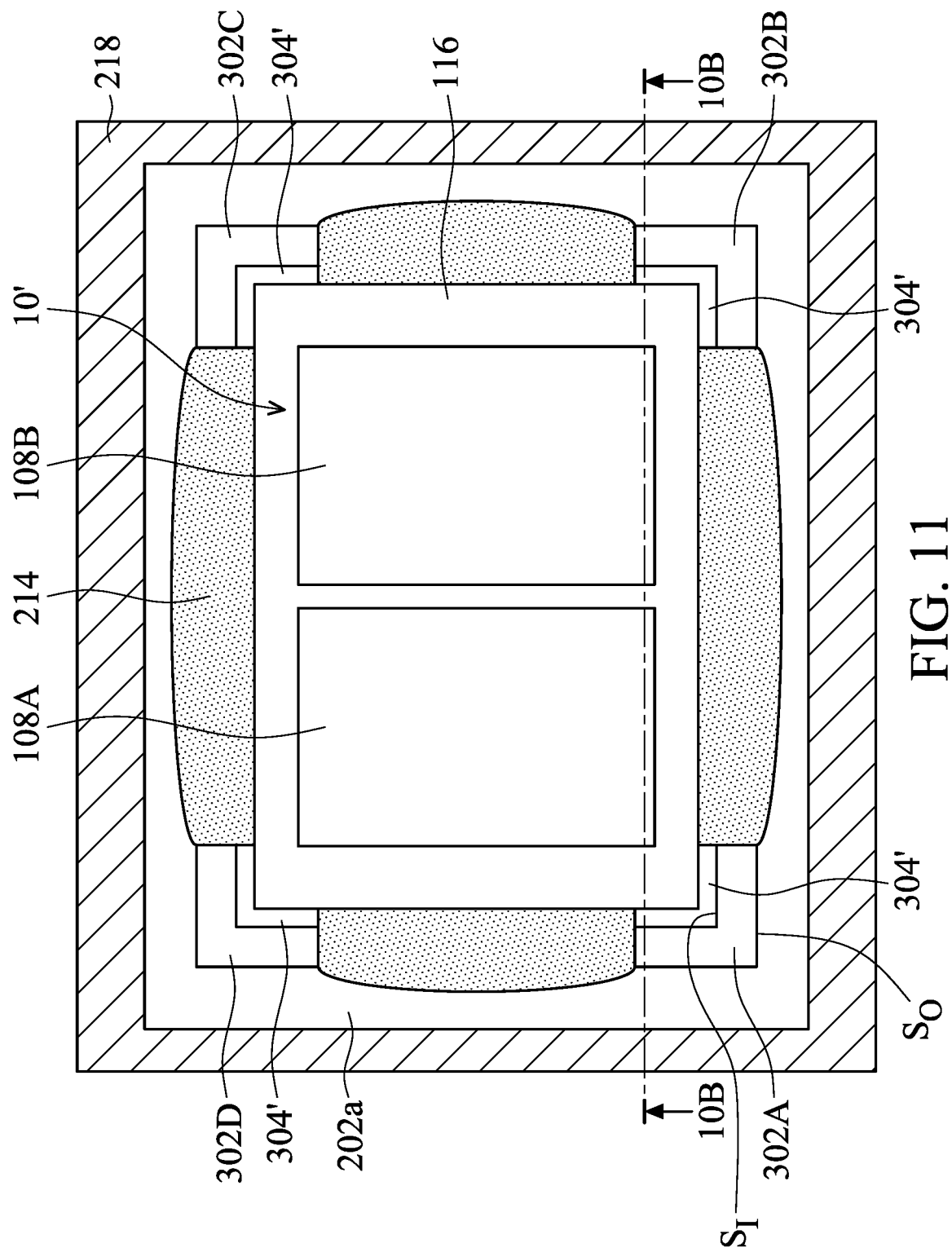
FIG. 11 is a plan view of a portion of a package structure, in accordance with some embodiments.

FIG. 11 is a plan view of a portion of a package structure, in accordance with some embodiments. In some embodiments, FIG. 11 shows the plan view of the structure shown in FIG. 10B. In some embodiments, FIG. 10B shows the cross-sectional view of the package structure taken along the line 10B-10B in FIG. 11.

In some embodiments, the gaps between the die package 10' and the reinforcing structures 302A to 302D are occupied by the adhesive layers 304', as shown in FIGS. 11 and 10B. The underfill structure 214 does not extend into the gaps between the die package 10' and the reinforcing structures 302A to 302D. In some embodiments, the underfill structure 214 is adjacent to the adhesive layers 304', as shown in FIGS. 10B and 11. In some embodiments, the underfill structure 214 is in direct contact with the adhesive layers 304'.

In some embodiments, the underfill structure 214 extends exceeding the inner sidewalls $S_I$ of the reinforcing structures 302A to 302D, as shown in FIG. 11. In some embodiments, the underfill structure 214 further extends exceeding the outer sidewalls $S_O$ of the reinforcing structures 302A to 302D, as shown in FIG. 11. In some embodiments, the underfill structure 214 does not reach the outer sidewalls $S_O$ of the reinforcing structures 302A to 302D, as shown in FIG. 11. The outer sidewalls $S_O$ of the reinforcing structures 302A to 302D are not in direct contact with the underfill structure 214.

Embodiments of the disclosure form a package structure with one or more reinforcing structures. The reinforcing structures are disposed over a circuit substrate where a die package is disposed. Each of the reinforcing structures partially surrounds a respective high stress region (such as a respective corner) of the die package. The reinforcing structures provide support to corner portions of the die package, so as to ensure good structural integrity of the die package. The crack risk of the die package near the corner portions is significantly reduced. The performance and reliability of the package structure are greatly improved.

In accordance with some embodiments, a package structure is provided. The package structure includes a circuit substrate and a die package bonded to the circuit substrate through bonding structures. The package structure also includes a reinforcing structure over the circuit substrate. The reinforcing structure partially surrounds a corner of the die package. The package structure further includes an underfill structure surrounding the bonding structure. The underfill structure is in direct contact with the reinforcing structure.

In accordance with some embodiments, a package structure is provided. The package structure includes a circuit substrate and a die package over the circuit substrate. The package structure also includes a reinforcing structure attached to the circuit substrate through an adhesive layer. The reinforcing structure has an inner sidewall and an outer sidewall, and the inner sidewall faces a first sidewall and a second sidewall of the die package. The package structure further includes an underfill structure between the circuit substrate and the die package. The underfill structure is adjacent to the adhesive layer.

In accordance with some embodiments, a method for forming a package structure is provided. The method includes disposing a die package and a reinforcing structure over a circuit substrate. The reinforcing structure partially surrounds a corner of the die package. The method also includes forming an underfill structure over the circuit substrate after the reinforcing structure is disposed. A first portion of the underfill structure is between the die package and the circuit substrate. A second portion of the underfill structure laterally extends exceeding an inner sidewall of the reinforcing structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    disposing a die package and a reinforcing structure over a circuit substrate, wherein the reinforcing structure partially surrounds a corner of the die package, the die package has a first sidewall and a second sidewall opposite to the first sidewall, and the reinforcing structure has an end located between extension lines of the first sidewall and the second sidewall; and
    forming an underfill structure over the circuit substrate after the reinforcing structure is disposed, wherein a first portion of the underfill structure is between the die package and the circuit substrate, a second portion of the underfill structure laterally extends exceeding an inner sidewall of the reinforcing structure, and the second portion of the underfill structure extends along and wraps around the end of the reinforcing structure, wherein in a top view of the package structure, the reinforcing structure has an outer corner, a first part of the second portion of the second portion of the underfill structure is between the outer corner of the reinforcing structure and the die package, and the outer corner of the reinforcing structure is exposed by the underfill structure.

2. The method for forming a package structure as claimed in claim 1, further comprising disposing a warpage-control element over the circuit substrate after the underfill structure is formed, wherein the warpage-control element surrounds the die package and the reinforcing structure.

3. The method for forming a package structure as claimed in claim 1, further comprising attaching the reinforcing structure to the circuit substrate through an adhesive layer, wherein the adhesive layer is in direct contact with the underfill structure.

4. The method for forming a package structure as claimed in claim 1, further comprising disposing a second reinforcing structure to partially surround a second corner of the die package before the underfill structure is formed.

5. The method for forming a package structure as claimed in claim 1, further comprising:
partially removing the circuit substrate to form a recess before the die package is disposed over the circuit substrate, wherein an element of the die package enters the recess after the die package is disposed over the circuit substrate.

6. The method for forming a package structure as claimed in claim 5, wherein the underfill structure fills the recess and surrounds the element of the die package.

7. The method for forming a package structure as claimed in claim 5, wherein the element of the die package is a chip structure.

8. The method for forming a package structure as claimed in claim 1, wherein the underfill structure has a third portion adjacent to a sidewall of the die package, and the first part of the second portion is thicker than the third portion.

9. The method for forming a package structure as claimed in claim 8, wherein the reinforcing structure has an outer sidewall, the inner sidewall is between the outer sidewall and the die package, and the inner sidewall is completely covered by the underfill structure.

10. The method for forming a package structure as claimed in claim 9, wherein the outer sidewall of the reinforcing structure is partially covered by the underfill structure.

11. The method for forming a package structure as claimed in claim 10, wherein the second portion of the underfill structure has a second part adjacent to the outer sidewall of the reinforcing structure, and the third portion of the underfill structure is thicker than the second part of the second portion.

12. The method for forming a package structure as claimed in claim 1, further comprising:
disposing a second reinforcing structure over the circuit substrate, wherein the second reinforcing structure partially surrounds a second corner of the die package, and the second reinforcing structure is separated from the reinforcing structure.

13. A method for forming a package structure, comprising:
disposing a die package over a substrate;
disposing a reinforcing structure over the substrate, wherein the reinforcing structure partially surrounds a corner of the die package, and the reinforcing structure has an L-shape top view profile or a C-shape top view profile; and
forming an underfill structure over the substrate, wherein a first portion of the underfill structure is between the die package and the substrate, a second portion of the underfill structure laterally extends across opposite sidewalls of the reinforcing structure, and the underfill structure wraps around an end of the reinforcing structure, wherein in a top view of the package structure, the reinforcing structure has an outer corner, a part of the second portion of the second portion of the underfill structure is between the outer corner of the reinforcing structure and the die package, and the underfill structure is not in direct contact with the outer corner of the reinforcing structure.

14. The method for forming a package structure as claimed in claim 13, further comprising:
disposing a second reinforcing structure over the substrate, wherein the second reinforcing structure partially surrounds a second corner of the die package, the second reinforcing structure has an end, and the die package extends across the end.

15. The method for forming a package structure as claimed in claim 14, further comprising:
disposing a warpage-control element over the substrate after the underfill structure is formed, wherein the warpage-control element surrounds the die package, the reinforcing structure, and the second reinforcing structure.

16. The method for forming a package structure as claimed in claim 13, wherein a top of the part of the second portion of the underfill structure is substantially as high as a top surface of the reinforcing structure.

17. A method for forming a package structure, comprising:
bonding a die package to a substrate through bonding structures, wherein the die package has a plurality of corners;
disposing a plurality of reinforcing structures over the substrate, wherein each of the corners of the die package is partially surrounded by at least one of the reinforcing structures, a reinforcing structure of the reinforcing structures has a portion extending across a corner of the corners, the portion has an end, and the die package extends across the end; and
forming an underfill structure surrounding the bonding structures, wherein the underfill structure partially surrounds the reinforcing structures and extends along and wraps around the end of the portion of the reinforcing structure, wherein in a top view of the package structure, the reinforcing structure of the reinforcing structures has an outer corner, a first portion of the underfill structure is between the outer corner of the reinforcing structure and the die package, and the outer corner of the reinforcing structure is separated from the underfill structure.

18. The method for forming a package structure as claimed in claim 17, wherein the underfill structure is formed to have a second portion and a third portion, the second portion is adjacent to the die package and an interior sidewall of a second reinforcing structure of the reinforcing structures, the third portion is adjacent to a sidewall of the die package and separated from the second reinforcing structure, and the second portion is thicker than the third portion.

19. The method for forming a package structure as claimed in claim 17, wherein top surfaces of the reinforcing structures are lower than a top surface of the die package.

20. The method for forming a package structure as claimed in claim 17, wherein the underfill structure is formed to be in direct contact with the reinforcing structures.

* * * * *